(12) United States Patent
Terai et al.

(10) Patent No.: US 8,890,234 B2
(45) Date of Patent: Nov. 18, 2014

(54) NONVOLATILE SEMICONDUCTOR MEMORY DEVICE

(71) Applicants: Masaya Terai, Kanagawa (JP); Shigeki Hattori, Kanagawa (JP); Hideyuki Nishizawa, Tokyo (JP); Koji Asakawa, Kanagawa (JP); Tsukasa Tada, Tokyo (JP)

(72) Inventors: Masaya Terai, Kanagawa (JP); Shigeki Hattori, Kanagawa (JP); Hideyuki Nishizawa, Tokyo (JP); Koji Asakawa, Kanagawa (JP); Tsukasa Tada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/721,860

(22) Filed: Dec. 20, 2012

(65) Prior Publication Data

US 2014/0061762 A1   Mar. 6, 2014

Related U.S. Application Data

(60) Provisional application No. 61/696,942, filed on Sep. 5, 2012.

(51) Int. Cl.
| | |
|---|---|
| *H01L 29/792* | (2006.01) |
| *H01L 21/28* | (2006.01) |
| *H01L 51/05* | (2006.01) |
| *H01L 27/115* | (2006.01) |
| *H01L 51/00* | (2006.01) |

(52) U.S. Cl.
CPC .......... *H01L 29/792* (2013.01); *H01L 29/7926* (2013.01); *H01L 21/28282* (2013.01); *H01L 51/0591* (2013.01); *H01L 27/11582* (2013.01); *H01L 51/0078* (2013.01)

USPC ............................... 257/324; 257/4; 257/289

(58) Field of Classification Search
USPC ......................... 257/E29.3–E29.309, 314–326
See application file for complete search history.

(56) References Cited

U.S. PATENT DOCUMENTS

| | | | |
|---|---|---|---|
| 7,132,678 B2 | 11/2006 | Kagan et al. | |
| 2004/0185600 A1* | 9/2004 | Kagan et al. | 257/40 |

(Continued)

FOREIGN PATENT DOCUMENTS

| | | |
|---|---|---|
| JP | 2007-524989 | 8/2007 |
| JP | 2008-53631 | 3/2008 |

(Continued)

OTHER PUBLICATIONS

Zhiming Liu, et al., "Molecular Memories That Survive Silicon Device Processing and Real-World Operation", Science, vol. 302, Nov. 28, 2003, pp. 1543-1545.

(Continued)

*Primary Examiner* — Marc Armand
*Assistant Examiner* — Quinton Brasfield
(74) *Attorney, Agent, or Firm* — Oblon, Spivak, McClelland, Maier & Neustadt, L.L.P.

(57) ABSTRACT

A nonvolatile semiconductor memory device of an embodiment includes: a semiconductor layer; a tunnel insulating film formed on the semiconductor layer; an organic molecular layer that is formed on the tunnel insulating film, and includes first organic molecules and second organic molecules having a smaller molecular weight than the first organic molecules, the first organic molecules each including a first alkyl chain or a first alkyl halide chain having one end bound to the tunnel insulating film, the first organic molecules each including a charge storage portion bound to the other end of the first alkyl chain or the first alkyl halide chain, the second organic molecules each including a second alkyl chain or a second alkyl halide chain having one end bound to the tunnel insulating film; a block insulating film formed on the organic molecular layer; and a control gate electrode formed on the block insulating film.

2 Claims, 26 Drawing Sheets

(56) References Cited

U.S. PATENT DOCUMENTS

| | | | |
|---|---|---|---|
| 2007/0078267 A1* | 4/2007 | Dotz et al. | 549/59 |
| 2007/0166924 A1* | 7/2007 | Kund et al. | 438/266 |
| 2008/0191256 A1* | 8/2008 | Bidan et al. | 257/298 |
| 2009/0008697 A1* | 1/2009 | Forbes | 257/315 |
| 2010/0163108 A1 | 7/2010 | Bessho et al. | |
| 2010/0221841 A1* | 9/2010 | Osaka et al. | 436/94 |
| 2013/0079484 A1* | 3/2013 | Jeong et al. | 528/43 |

FOREIGN PATENT DOCUMENTS

| | | |
|---|---|---|
| JP | 2008-172059 | 7/2008 |
| JP | 2009-218244 | 9/2009 |
| JP | 2011-86765 | 4/2011 |
| WO | WO 2004/086458 A2 | 10/2004 |
| WO | WO 2012/127863 A1 | 9/2012 |

OTHER PUBLICATIONS

Jonathan Shaw, et al., "Integration of Self-Assembled Redox Molecules in Flash Memory Devices", IEEE Transactions on Electron Devices, vol. 58, No. 3, Mar. 2011, pp. 826-834.

U.S. Appl. No. 14/022,756, filed Sep. 10, 2013, Nishizawa, et al.

* cited by examiner

FIG.4A

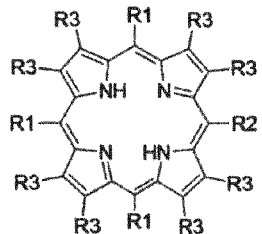

R1, R2, and R3 can be selected independently of one another.
R1, R2, and R3 might be the same.
At least one of R1 through R3 is bound to connecting portion 26c.

FIG.4B

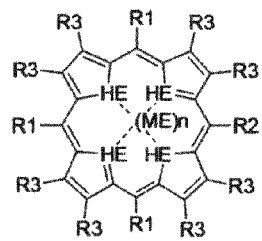

R1, R2, and R3 can be selected independently of one another.
R1, R2, and R3 might be the same.
At least one of R1 through R3 is bound to connecting portion 26c.
HE: Hetero atom
ME: Metal atom (Zn, Ti, Cu, Ir, Ru, Ni, Co, Li, Mn, Mg)
n=0, 1

FIG.4C

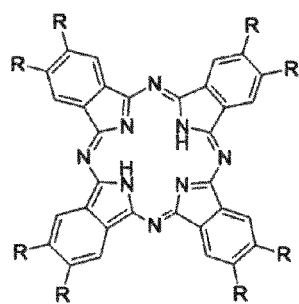

FIG.4D

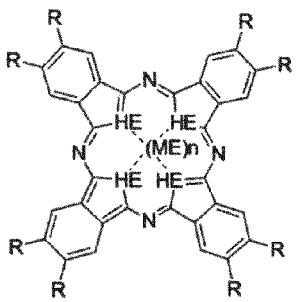

HE: Hetero atom
ME: Metal atom (Zn, Ti, Cu, Ir, Ru, Ni, Co, Li, Mn, Mg)
n=0, 1
At least one of R is bound to connecting portion 26c.

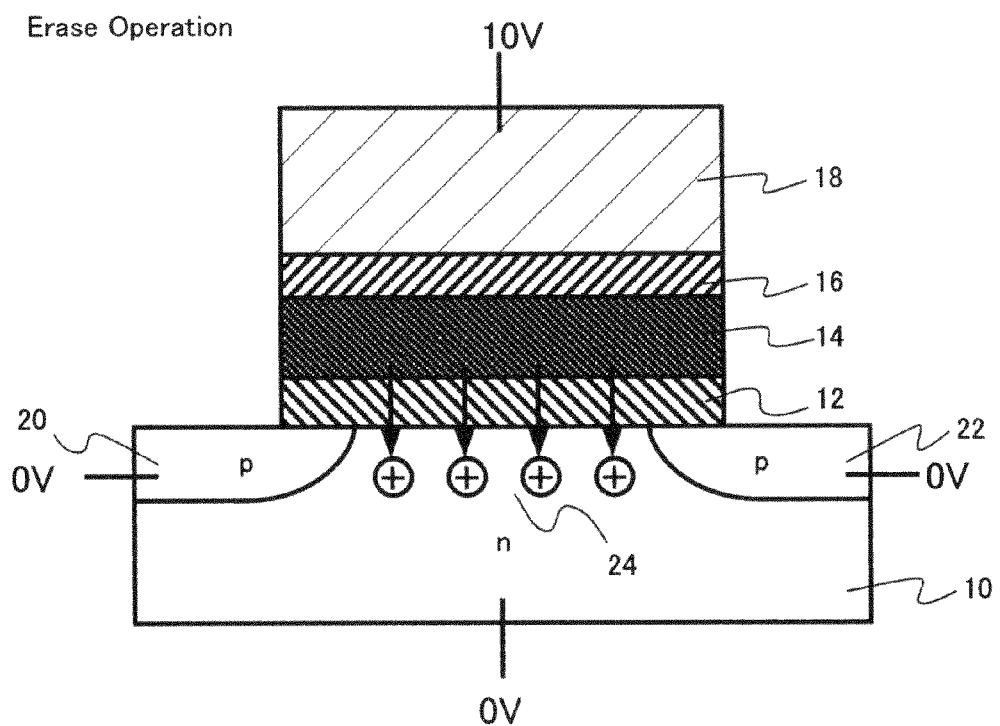

Erase Operation

Read Operation: DATA "0"

Read Operation: DATA "1"

FIG.21
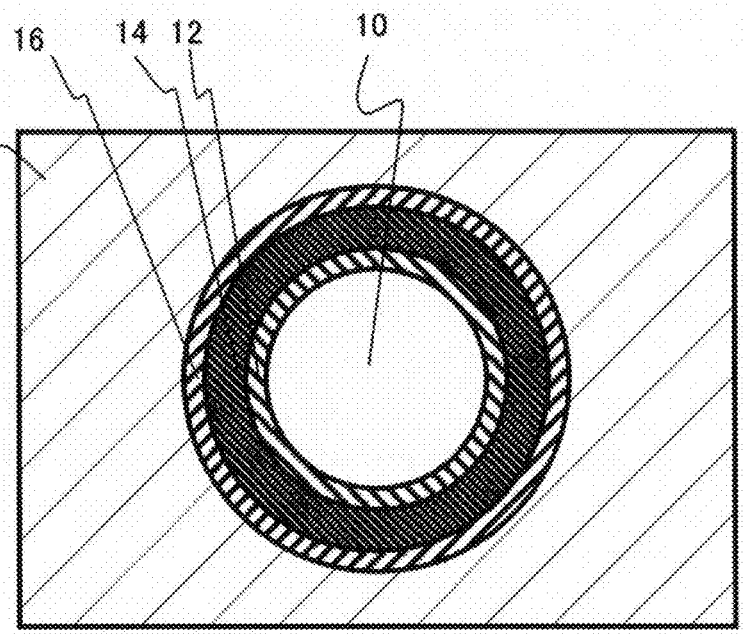
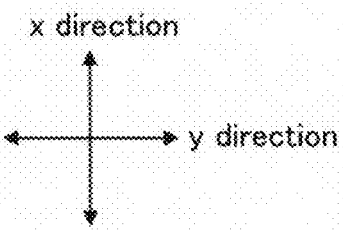

NONVOLATILE SEMICONDUCTOR MEMORY DEVICE

CROSS-REFERENCE TO RELATED APPLICATION

This application is based upon and claims the benefit of priority from U.S. Provisional Application No. 61/696,942, filed on Sep. 5, 2012, the entire contents of which are incorporated herein by reference.

FIELD

Embodiments described herein relate generally to nonvolatile semiconductor memory devices.

BACKGROUND

Scaling-down the size of each memory cell is effective in realizing a lower bit cost and improving the memory performance of a nonvolatile semiconductor memory device. However, scaling-down of memory cells is becoming technically difficult.

In view of this, the use of organic molecules in charge storage layers has been suggested. With organic molecules, it is possible to achieve organic syntheses of various molecular structures and substituent groups. Because of this, desired electrochemical characteristics can be provided, and each structural unit is small. Accordingly, there is a possibility that memory cells can be further scaled-down.

Many organic molecules used for charge storage layers are polycyclic derivatives such as porphyrin having stable redox reactions. However, those organic molecules have steric hindrance. So, the molecular density is not sufficiently high in fabrication of self-assembled monolayer. Furthermore, formation of high steric hindrance molecule might be low orientation, even if that molecule have high orientaional portions such as long-alkyl chain. Therefore, it is difficult to increase the density of stored charges and secure a sufficient data retention time.

BRIEF DESCRIPTION OF THE DRAWINGS

FIGS. 4A through 4D are diagrams showing example molecular structures of charge storage portions according to the first embodiment;

FIG. 6 is a diagram for explaining a memory cell erase operation according to the first embodiment;

FIG. 21 is an X-Y cross-sectional view of the nonvolatile semiconductor memory device shown in FIG. 20;

DETAILED DESCRIPTION

A nonvolatile semiconductor memory device of this embodiment includes: a semiconductor layer; a tunnel insulating film formed on the semiconductor layer; an organic molecular layer that is formed on the tunnel insulating film, and includes first organic molecules and second organic molecules having a smaller molecular weight than the first organic molecules, the first organic molecules each including a first alkyl chain or a first alkyl halide chain having one end bound to the tunnel insulating film, the first organic molecules each including a charge storage portion bound to the other end of the first alkyl chain or the first alkyl halide chain, the second organic molecules each including a second alkyl chain or a second alkyl halide chain having one end bound to the tunnel insulating film; a block insulating film formed on the organic molecular layer; and a control gate electrode formed on the block insulating film.

The following is a description of embodiments, with reference to the accompanying drawings.

First Embodiment

A nonvolatile semiconductor memory device of this embodiment includes: a semiconductor layer; a tunnel insulating film formed on the semiconductor layer; an organic molecular layer formed on the tunnel insulating film; a block insulating film formed on the organic molecular layer; and a control gate electrode formed on the block insulating film. The organic molecular layer includes first organic molecules and second organic molecules having a smaller molecular weight than the first organic molecules. The first organic molecules each include a first alkyl chain or a first alkyl halide chain having one end bound to the tunnel insulating film, and a charge storage portion bound to the other end of the first alkyl chain or the first alkyl halide chain. The second organic molecules each include a second alkyl chain or a second alkyl halide chain having one end bound to the tunnel insulating film.

The nonvolatile semiconductor memory device of this embodiment includes charge storage molecules (the first organic molecules) having the charge storage portion in the organic molecular layer to be the charge storage layer, and packing molecules (the second organic molecules) filling the spaces between the charge storage molecules (the first organic molecules). The charge storage molecules and the packing molecules each have one end chemically bound to the tunnel insulating film.

Having the above described structure, the nonvolatile semiconductor memory device of this embodiment improves the characteristics of data writing into the charge storage layer. Further, by selecting an appropriate combination of the first organic molecules and the second organic molecules, the data retention characteristics are improved.

Figure 1:
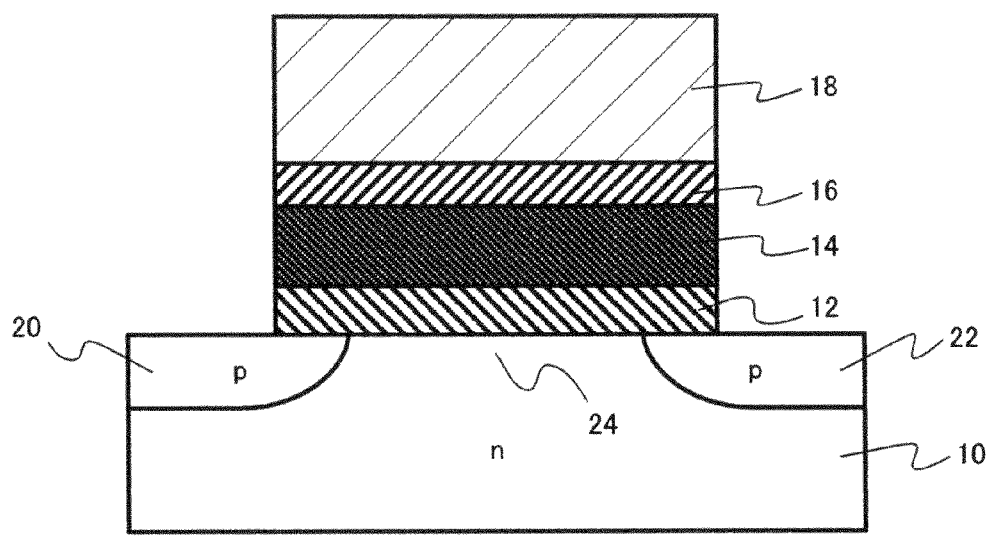
FIG. 1 is a cross-sectional view of a memory cell portion of a nonvolatile semiconductor memory device according to a first embodiment.
Figure 2:
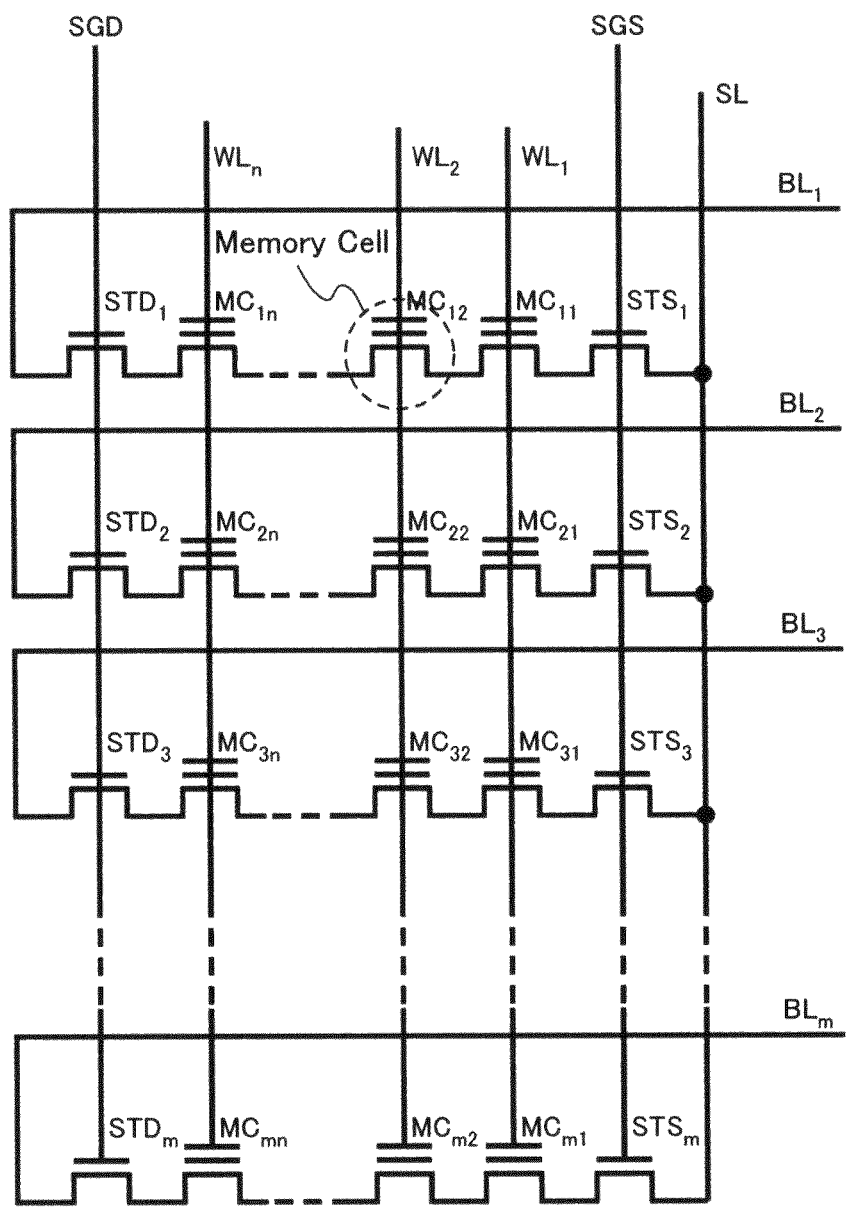
FIG. 2 is a circuit diagram of the memory cell array of the nonvolatile semiconductor memory device according to the first embodiment.

FIG. 1 is a cross-sectional view of a memory cell portion of the nonvolatile semiconductor memory device according to this embodiment. FIG. 2 is a circuit diagram of the memory cell array of the nonvolatile semiconductor memory device according to this embodiment. The nonvolatile semiconductor memory device of this embodiment is a NAND nonvolatile semiconductor memory device.

As shown in FIG. 2, the memory cell array is formed with memory cell transistors $MC_{11}$ through $MC_{1n}$, $MC_{21}$ through $MC_{2n}$, ..., and $MC_{m1}$ through $MC_{mn}$, which are (m×n) transistors (m and n being integers) with floating-gate structures, for example. In the memory cell array, those memory cell transistors are arranged in the column direction and in the row direction, and are thus arranged in a matrix fashion.

In the memory cell array, the memory cell transistors $MC_{11}$ through $MC_{1n}$, and select gate transistors $STS_1$ and $STD_1$ are connected in series, to form a NAND string (a memory string) that is a cell unit.

The drain region of the select gate transistor $STS_1$ for selecting the memory cell transistors $MC_{11}$ through $MC_{1n}$ is connected to the source region of the memory cell transistor $MC_{11}$ located at an end of the row of the memory cell transistors $MC_{11}$ through $MC_{1n}$, which are connected in series. Also, the source region of the select gate transistor $STD_1$ for selecting the memory cell transistors $MC_{11}$ through $MC_{1n}$ is connected to the drain region of the memory cell transistor $MC_{1n}$ located at an end of the row of the memory cell transistors $MC_{11}$ through $MC_{1n}$, which are connected in series.

Select gate transistors $STS_2$ through $STS_m$, the memory cell transistors $MC_{21}$ through $MC_{2n}$, ..., and $MC_{m1}$ through $MC_{mn}$, and select gate transistors $STD_2$ through $STD_m$ are also connected in series, to form respective NAND strings.

A common source line SL is connected to the sources of the select gate transistors $STS_1$ through $STS_m$.

The memory cell transistors $MC_{11}$, $MC_{21}$, ..., and $MC_{m1}$, the memory cell transistors $MC_{12}$, $MC_{22}$, ..., and $MC_{m2}$, ... and the memory cell transistors $MC_{1n}$, $MC_{2n}$, ..., and $MC_{mn}$ are connected by respective word lines $WL_1$ through $WL_n$, which control the operating voltages to be applied to the control gate electrodes.

Also, a common select gate line SGS is provided for the select gate transistors $STS_1$ through $STS_m$, and a common select gate line SGD is provided for the select gate transistors $STD_1$ through $STD_m$.

Peripheral circuits (not shown) are formed around the memory cell array illustrated in FIG. 2.

FIG. 1 shows the cross-section of a memory cell in the memory cell array illustrated in FIG. 2, or the memory cell surrounded by a dashed line in FIG. 2, for example. In this embodiment, the transistors of the memory cells are p-type transistors having holes as carriers, for example.

Each memory cell is formed on an n-type silicon semiconductor layer 10 containing n-type impurities, for example. A tunnel insulating film 12 is formed on the silicon semiconductor layer 10, a charge storage layer (an organic molecular layer) 14 is formed on the tunnel insulating film 12, a block insulating film 16 is formed on the charge storage layer 14, and a control gate electrode 18 is formed on the block insulating film 16. On both sides of the control gate electrode 18, a source region 20 and a drain region 22 are formed in the semiconductor layer 10. The region located below the control gate electrode 18 in the semiconductor layer 10 serves as a channel region 24. The channel region 24 is interposed between the source region 20 and the drain region 22.

Here, the charge storage layer 14 has a function to actively store charges as memory cell information. When writing or erasing is performed on the memory cell, the tunnel insulating film 12 functions as an electron/hole transfer pathway between the channel region 24 in the semiconductor layer 10 and the charge storage layer 14 through a tunneling phenomenon. At the time of reading or standing by, the tunnel insulating film 12 has a function to restrain electron/hole transfers between the channel region 24 and the charge storage layer 14 by its barrier height. The block insulating film 16 is a so-called interelectrode insulating film, and has a function to block the electron/hole flow between the charge storage layer 14 and the control gate electrode 18.

Other than silicon, silicon germanide, germanium, a compound semiconductor, or the like can be used as the semiconductor layer 10.

The tunnel insulating film 12 is a silicon oxide ($SiO_2$) film, for example. The charge storage layer 14 is an organic molecular layer formed with organic molecules, and is approximately 1 to 20 nm in thickness.

The tunnel insulating film 12 may be either a single-layer film or a multilayer film. The material of the tunnel insulating film 12 is not limited to the above-mentioned silicon oxide, but some other insulating film may be used as appropriate.

The block insulating film 16 is a hafnium oxide film, for example. Other than the above-mentioned hafnium oxide ($HfO_2$), an aluminum oxide ($Al_2O_3$) film may be used as the block insulating film 16. The block insulating film 16 may be either a single-layer film or a film stack.

The control gate electrode 18 is polycrystalline silicon that has impurities introduced thereinto and has obtained conductive properties. Any conductive material can be used as the control gate electrode 18. Other than the above-mentioned polycrystalline silicon, amorphous silicon that has impurities introduced thereinto and has obtained conductive properties can be used as the control gate electrode 18. Also, a metal, an alloy, a metal semiconductor compound, or the like may be used as the control gate electrode 18.

The source region 20 and the drain region 22 are formed with p-type diffusion layers containing p-type impurities, for example.

Figure 3:
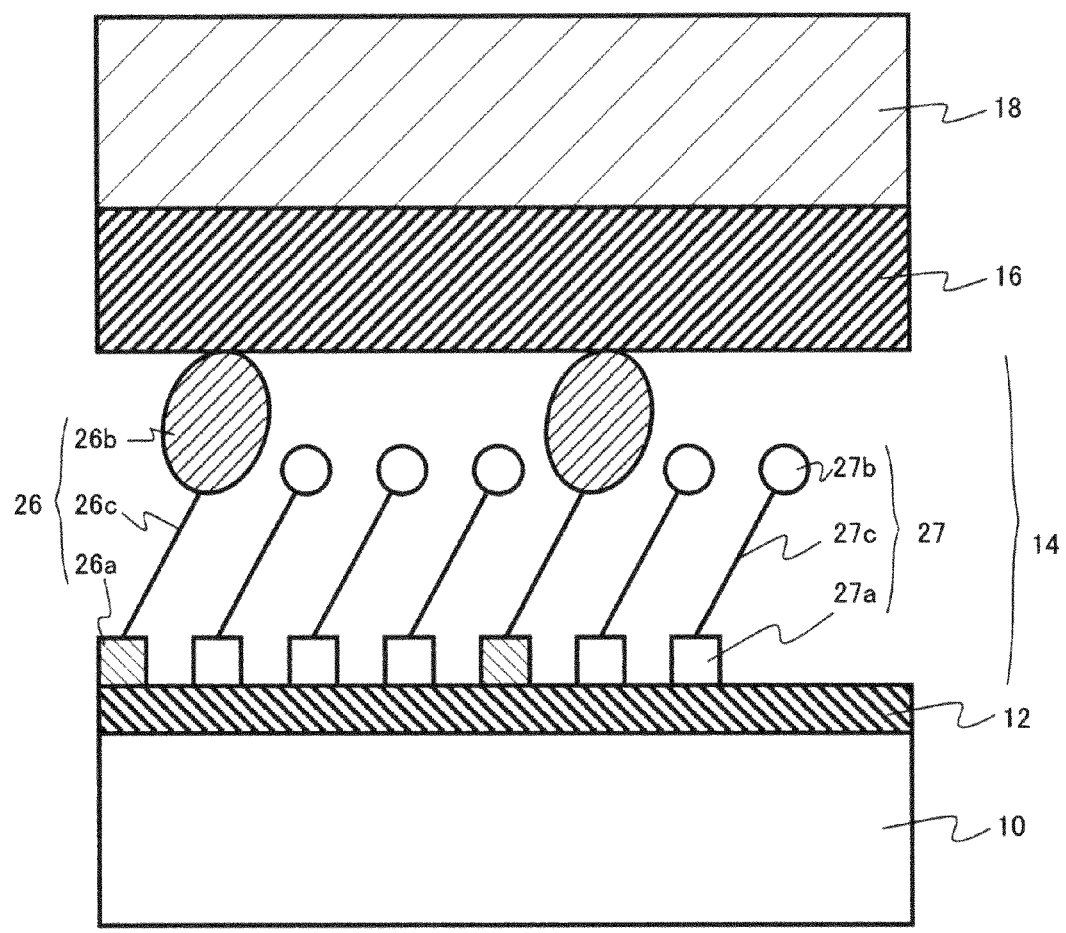
FIG. 3 is an enlarged cross-sectional view of a memory cell portion of the nonvolatile semiconductor memory device according to the first embodiment.

FIG. 3 is an enlarged cross-sectional view of a memory cell portion of the nonvolatile semiconductor memory device according to this embodiment. FIG. 3 is a diagram showing the charge storage layer (the organic molecular layer) 14 in detail.

The charge storage layer 14 is formed with at least two kinds of organic molecules. Of the two or more kinds, at least one is charge storage molecules (first organic molecules) 26, and the other one is packing molecules (second organic molecules) 27.

The packing molecules (the second organic molecules) 27 have a smaller molecular weight than the charge storage molecules (the first organic molecules) 26. The charge storage molecules 26 include a first alkyl chain or a first alkyl halide chain having one end bound to the tunnel insulating film 12, and a charge storage portion 26b bound to the other end of the first alkyl chain or the first alkyl halide chain. The packing molecules 27 include a second alkyl chain or a second alkyl halide chain having one end bound to the tunnel insulating film 12.

The charge storage molecules 26 have a function to store charges that are to be memory cell data. The packing molecules 27 fill the spaces between the charge storage molecules 26, and has a function to improve data write characteristics or data retention characteristics.

From the viewpoint of scaling-down of memory cells, the charge storage layer 14 is preferably a monomolecular film.

As shown in FIG. 3, each charge storage molecule 26 is formed with an end group 26a chemically bound to the tunnel insulating film 12, a charge storage portion 26b storing charges, and a connecting portion 26c connecting the end group 26a and the charge storage portion 26b.

The end group 26a functions to chemisorb the charge storage molecules 26 onto the tunnel insulating film 12 by chemical binding (covalent binding, ion binding, or metallic binding). Accordingly, the charge storage molecules 26 are not stacked on one another, and are positioned on the tunnel insulating film 12. Thus, the charge storage molecules 26 form a monolayer molecular film, and scaling-down can be achieved by virtue of good film uniformity and thinner device thickness.

It is preferable to use a chemical reactive group that is normally used in a self-assembled monolayer (SAM). For example, the end group 26a is preferably selected from silyl groups, alkoxysilyl groups, alkylsilyl groups, chlorosilyl groups, phosphonyl groups, alkyl selenide groups, telluride groups, sulfide groups, disulfide groups, thio groups, isocyanate groups, alkyl bromide groups, carbonyl groups, alkoxy groups, alkane, and alkene.

The charge storage portion 26b functions to store charges by applying electric fields. The charge storage portion 26b preferably has a polycyclic structure. For example, it is possible to use macrocyclic molecules such as porphyrin or phthalocyanine, and non-macrocyclic molecules such as metallocene, pentacene, anthracene, oligophenylenevinylene, thiophene, tetrathiafulvalene, tetracyanoquinodimethane, tetramethyltetraselenafulvalene, and fullerene. Not only those molecules but also derivatives of those molecules can be used.

The charge storage portion 26b is preferably a porphyrin derivative, a phthalocyanine derivative, a chlorine derivative, a tetrapyrrole derivative, a bipyridine derivative, an indole derivative, an acene derivative, a quinoxaline derivative, a phenylenevinylene derivative, or a fullerene derivative.

The charge storage portion 26b is preferably an organic molecule having a polycyclic structure of 100 to 2000 in molecular weight. If the molecular weight is less than 100, a π-conjugated system is not sufficiently developed, and stable exchanges of charges (redox reactions) become difficult. If the molecular weight is more than 2000, the thickness of the charge storage layer becomes too large, and responding to a request for scaling-down becomes difficult.

FIGS. 4A through 4D are diagrams showing example molecular structures of charge storage portions. In these examples, porphyrin, a porphyrin derivative, phthalocyanine, and a phthalocyanine derivative are used as the charge storage portions 26b.

R1 through R3 and R in FIGS. 4A through 4D are hydrogen, alkyl groups, fluoroalkyl groups, alkoxy groups, aryl groups, halogen groups, hydroxy groups, amino groups, nitro groups, phenyl groups, cycloalkyl groups, carboxy groups, amide groups, imide groups, cyano groups, thiol groups, fluorophenyl groups, or the like. Here, at least one of those groups is bound to the connecting portion 26c. In that case, other than a C—C bond, a connecting portion such as an ether bond (—O—) or an amino bond (—NH—) might be provided between the charge storage portion 26b and the connecting portion 26c.

In a case where a central metal is contained as in FIG. 4B, charges might be given to and taken from the electron orbital of the metal. The metal element in this case is selected from Zn, Ti, Cu, Ir, Ru, Ni, Co, Li, Mn, and Mg, for example. If a π-conjugated system can be formed, a macrocyclic molecular structure containing heteroatoms as shown in FIGS. 4B and 4D is preferable.

Each connecting portion 26c functions to connect the end group 26a and the charge storage portion 26b. Each connecting portion 26c also plays an important role in the molecular orientation formed by the intermolecular force between the charge storage molecules 26 and the intermolecular force between the charge storage molecules 26 and the packing molecules 27. That is, the connecting portions 26c have a function to adsorb the charge storage molecules 26 and the packing molecules 27 at a high density by virtue of the molecular orientation.

To achieve the effect, each connecting portion 26c preferably has a straight-chain molecular structure, and is an alkyl chain (a first alkyl chain) or an alkyl halide chain (a first alkyl halide chain). An alkyl halide chain is formed by substituting part of or all of the hydrogen in an alkyl chain with halogen. For example, an alkyl chain and a fluoroalkyl chain expressed by the following formulas (A1) and (B1) may be used:

[Formula (A1)]

[Formula (B1)]

Here, R represents the end group 26a and the charge storage portion 26b. Meanwhile, m is an integer of 1 to 20.)

As the value of m becomes greater, the intermolecular force becomes larger, and the ease of molecular orientation varies. However, if each connecting portion 26c is too long, the film thickness of the charge storage layer becomes too large to respond to a request for scaling-down. Also, if each connecting portion 26c is too long, the formation of a monomolecular film becomes difficult.

Therefore, m is preferably 1 to 20. That is, the carbon number in the alkyl chain (the first alkyl chain) or the alkyl halide chain (the first alkyl halide chain) of each connecting portion 26c is preferably 1 to 20.

Each charge storage molecule (each first organic molecule) 26 is preferably an organic molecule expressed by the following general formula (1):

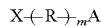   [General formula (1)]

In the general formula (1), X represents a substituent group selected from silyl groups, alkoxysilyl groups, alkylsilyl groups, chlorosilyl groups, phosphonyl groups, alkyl selenide groups, telluride groups, sulfide groups, disulfide groups, thio groups, isocyanate groups, alkyl bromide groups, carbonyl groups, alkoxy groups, alkane, and alkene. R represents an alkyl group or an alkyl halide group. A represents a substituent group having a polycyclic structure of 100 to 2000 in molecular weight. Meanwhile, m represents a positive integer of 1 to 20. More preferably, the substituent group A is a porphyrin derivative, a phthalocyanine derivative, a chlorine derivative, a tetrapyrrole derivative, a bipyridine derivative, an indole derivative, an acene derivative, a quinoxaline derivative, or a fullerene derivative.

The packing molecules (the second organic molecules) 27 are molecules that have large intermolecular forces and can be adsorbed to the tunnel insulating film 12 at a high density. The packing molecules 27 enter the spaces between the charge storage molecules 26, and are adsorbed onto portions of the surface of the tunnel insulating film 12 to which the charge storage molecules 26 do not make chemical bound.

As shown in FIG. 3, each packing molecule 27 is formed with an end group 27a chemically bound to the tunnel insulating film 12, a head portion 27b located on the opposite end of the packing molecule 27 from the end group 27a, and a connecting portion 27c connecting the end group 27a and the head portion 27b.

The end group 27a of each packing molecule 27 functions to chemisorb the charge storage molecules 26 onto the tunnel insulating film 12 by chemical binding (covalent binding, ion binding, or metallic binding), like the end group 26a of each charge storage molecule 26. Therefore, the material is preferably selected from those mentioned in the description of the end group 26a of each charge storage molecule 26. The end groups 27a may be the same as or different from the end groups 26a.

Each head portion 27b plays an important role in determining the permanent dipole of the packing molecule 27. Each packing molecule 27 needs to have a smaller steric hindrance and a larger intermolecular force than each charge storage molecule 26. Therefore, it is preferable to select a substituent group having a small steric hindrance. To minimize the steric hindrance, it is preferable to select hydrogen.

In a case where the orientation of the permanent dipole is positive on the tunnel insulating film side, and is negative on the block insulating film side, it is preferable to select a substituent group having electron withdrawing properties. Each head portion 27b is preferably selected from fluorine, chlorine, bromine, iodine, azido groups ($-N_3$), amino groups, cyano groups ($-CN$), acetamide groups ($-CO-NH_2$), and nitro groups ($-NO_2$).

Each connecting portion 27c functions to connect the end group 27a and the head portion 27b. Each connecting portion 27c also plays an important role in the molecular orientation formed by the intermolecular force between the charge storage molecules 26 and the intermolecular force between the charge storage molecules 26 and the packing molecules 27 as described above.

That is, the connecting portions 27c have a function to adsorb the charge storage molecules 26 and the packing molecules 27 at a high density by virtue of the molecular orientation. To achieve the effect, each connecting portion 27c preferably has a straight-chain molecular structure, and is an alkyl chain (a second alkyl chain) or an alkyl halide chain (a second alkyl halide chain). For example, an alkyl chain and a fluoroalkyl chain expressed by the following formulas (A2) and (B2) may be used:

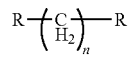   [Formula (A2)]

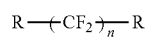   [Formula (B2)]

Here, R represents the end group 27a and the head portion 27b. Meanwhile, n is an integer of 1 to 20.

The value of n can be the same as m, and is preferably not smaller than 1 and not larger than 20. That is, the carbon number in the alkyl chain (the second alkyl chain) or the alkyl halide chain (the second alkyl halide chain) of each connecting portion 27c is preferably not smaller than 1 and not larger than 20.

As the packing molecules 27 need to fill the spaces between the charge storage molecules 26, it is not preferable to make the connecting portions 27c longer than the connecting portions 26c. Therefore, the carbon number in the second alkyl chain or the second alkyl halide chain is preferably the same or smaller than the carbon number in the first alkyl chain or the first alkyl halide chain. That is, m and n in the above formulas (A1), (B1), (A2), and (B2) are preferably expressed as $n \leq m$.

Each packing molecule (each second organic molecule) 27 is preferably an organic molecule expressed by the following general formula (2):

   [General formula (2)]

In the general formula (2), X represents a substituent group selected from silyl groups, alkoxysilyl groups, alkylsilyl groups, chlorosilyl groups, phosphonyl groups, alkyl selenide groups, telluride groups, sulfide groups, disulfide groups, thio groups, isocyanate groups, alkyl bromide groups, carbonyl groups, alkoxy groups, alkane, and alkene. R represents an alkyl group or an alkyl halide group. B represents hydrogen, fluorine, chlorine, bromine, iodine, an azido group ($-N_3$), an amino group, a cyano group ($-CN$), an acetamide group ($-CO-NH_2$), a nitro group ($-NO_2$), or an alkylketone group. Meanwhile, n represents a positive integer of 1 to 20. To form a permanent dipole in each packing molecule (each second organic molecule), it is more preferable for B to be an azido group, an amino group, a cyano group, an acetamide group, a nitro group, or an alkylketone group.

Figure 5:
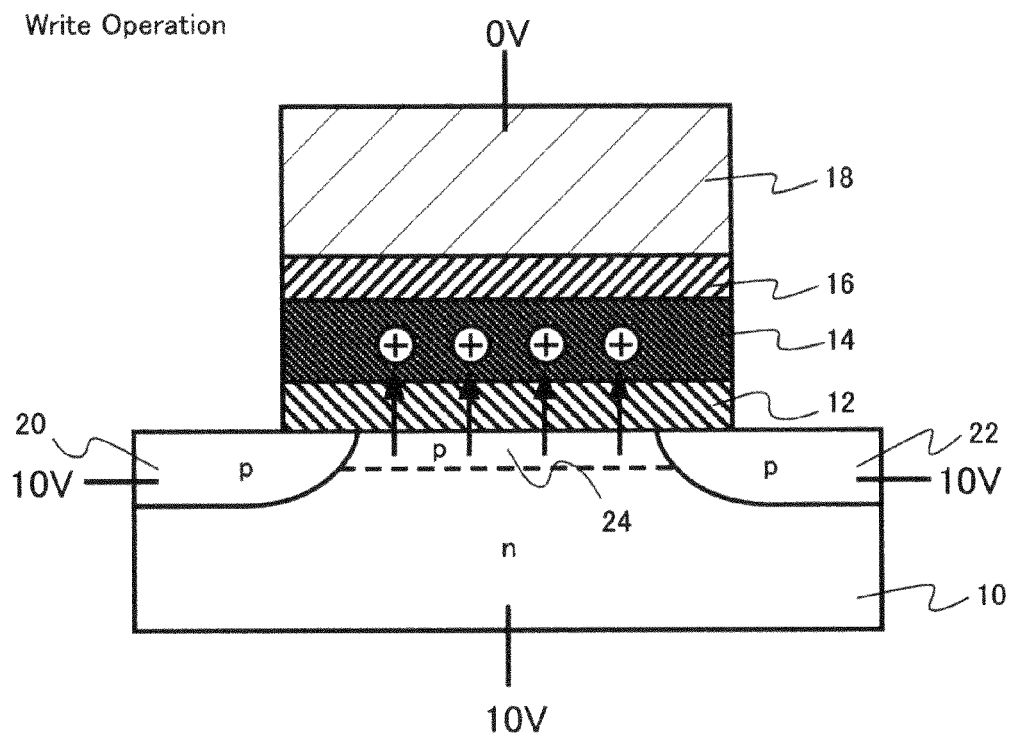
FIG. 5 is a diagram for explaining a memory cell write operation according to the first embodiment.

Next, examples of memory cell write, erase, and read operations are described. FIG. 5 is a diagram for explaining a memory cell write operation according to this embodiment.

In a memory cell write operation, a voltage is applied between the control gate electrode 18 and the semiconductor layer 10 so that the control gate electrode 18 has a negative voltage in a relative term, and positive charges are stored into the charge storage layer 14. As shown in FIG. 5, 0 V is applied to the control gate electrode 18, and 10 V is applied to the semiconductor layer 10, for example. 10 V is applied to the source region 20 and the drain region 22, for example.

An inversion layer is formed in the channel region 24, and holes are stored. The holes move in the tunnel insulating film 12, and are stored into the charge storage molecules of the charge storage layer 14.

Even when the voltage between the control gate electrode 18 and the semiconductor layer 10 is returned to 0 V, the stored holes are maintained. In this state, the threshold value of the transistor of the memory cell becomes higher than that in a state where holes are not stored. That is, the transistor is not easily turned on in this state. This state is a state where data "0" is written.

FIG. 6 is a diagram for explaining a memory cell erase operation according to this embodiment. In a data erase operation, a voltage is applied between the control gate electrode 18 and the semiconductor layer 10 so that the voltage of the control gate electrode 18 becomes positive in a relative term. As shown in FIG. 6, 10 V is applied to the control gate electrode 18, and 0 V is applied to the semiconductor layer 10, for example. 0 V is applied to the source region 20 and the drain region 22, for example.

Because of the electric field between the control gate electrode 18 and the semiconductor layer 10, the holes stored in the charge storage layer 14 move in the tunnel insulating film 12, and are pulled into the semiconductor layer 10.

When the voltage between the control gate electrode 18 and the semiconductor layer 10 is returned to 0 V, the stored charges disappear. Therefore, the threshold value of the transistor of the memory cell becomes lower than that in the data "0" state. That is, the transistor is easily turned on this state. This state is a data "1" state.

Figure 7A:
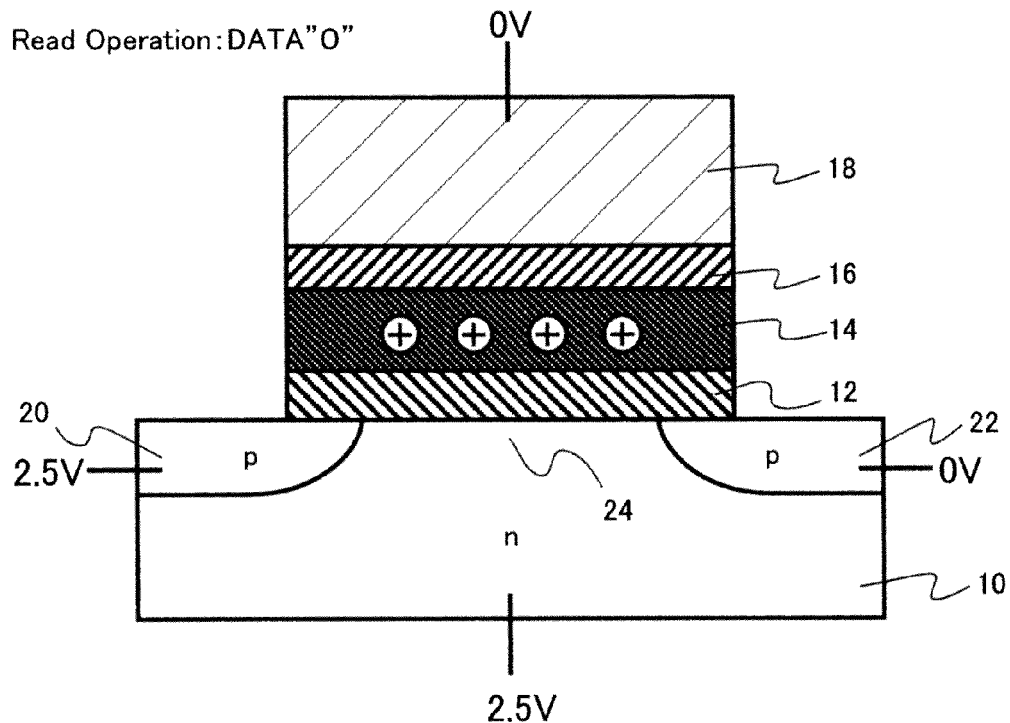
FIGS. 7A and 7B are diagrams for explaining memory cell read operations according to the first embodiment.
Figure 7B:
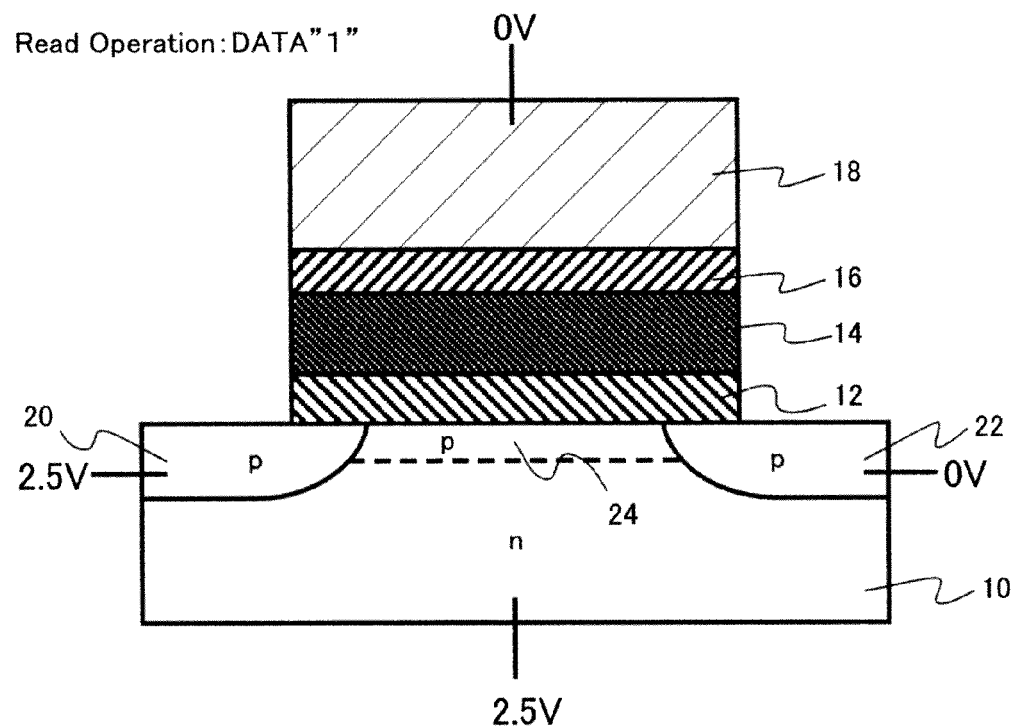

FIGS. 7A and 7B are diagrams for explaining memory cell read operations according to this embodiment. FIG. 7A illustrates a data "0" read operation, and FIG. 7B illustrates a data "1" read operation. In a data read operation, a voltage is applied between the source region 20 and the drain region 22.

As shown in FIGS. 7A and 7B, while 0 V is being applied between the control gate electrode 18 and the semiconductor layer 10, 2.5 V is applied to the source region 20, and 0 V is applied to the drain region 22, for example. As shown in FIG. 7A, in the data "0" state where holes are stored, for example, the threshold value of the transistor is high. Therefore, an inversion layer is not formed in the channel region 24, and a current does not flow between the source and the drain.

On the other hand, in an erased state, or in the data "1" state where charges are not stored, as shown in FIG. 7B, the threshold value of the transistor is low. Therefore, an inversion layer is formed in the channel region 24, and the current flows between the source and the drain. As the amount of current in the transistor is sensed in this manner, the data "0" or the data "1" can be read out.

In a data verify operation to determine whether writing has been sufficiently performed after a data write operation is performed, the same operation as that in a read operation is performed. A voltage is applied between the source region 20 and the drain region 22, and if a desired current does not flow, a data write operation is performed again.

The write, erase, and read operations according to this embodiment are performed as described above, so as to realize a nonvolatile semiconductor memory device.

Next, the effects and advantages of the nonvolatile semiconductor memory device of this embodiment are described.

Having the above described structure, the nonvolatile semiconductor memory device of this embodiment improves the characteristics of data writing into the charge storage layer. Further, by selecting an appropriate combination of the first organic molecules and the second organic molecules, the data retention characteristics are improved.

The charge storage molecules 26 and the packing molecules 27 adsorb chemically onto the tunnel insulating film 12, and finally form an uniform organic molecule layer.

As described above, the charge storage molecules 26 function to store charges that are injected from the channel region 24 via the tunnel insulating film 12. On the other hand, the packing molecules 27 function to fill the spaces between the charge storage molecules 26.

For example, the packing molecules 27 are preferably designed as molecules that have a smaller free volume than the charge storage molecules 26, and have a larger intermolecular force than the charge storage molecules 26. With this arrangement, the packing molecules 27 can be chemisorbed and fill the spaces at a higher density than the charge storage molecules 26.

The permittivity of the packing molecules 27 and the orientation of the permanent dipole in each packing molecule 27, can control the functions to facilitate the injection of charges, so as to improve the write characteristics. Moreover, they can control the functions to keep stored charges, so as to improve the data retention characteristics.

First, improvement of write characteristics is described.

Many organic molecules have relatively low relative permittivity approximately 3. This is smaller than the relative permittivity of $SiO_2$, which is 3.9.

The charge storage molecules 26 and the packing molecules 27 are chemisorbed onto the tunnel insulating film 12. Accordingly, when the charge storage portions serving to store charges in the charge storage molecules 26 are located further away from the tunnel insulating film 12 than the packing molecules 27, the packing molecules 27 can also function substantially as an insulating film.

The substantial physical film thickness of the tunnel insulating film becomes larger by the thickness equivalent to the packing molecules 27. Because the relative permittivity of the packing molecules 27 is low, the relative permittivity of the virtual tunnel insulating film formed by combining the tunnel insulating film 12 and the packing molecules 27 is lower than 3.9. So when the combined insulated film is used, the electric field becomes high. As a result, charge injection is facilitated, so as to improve the write characteristics.

In a case where positive charges are stored in the charge storage molecules as in this embodiment, it is preferable to select such molecules that the entire orientation of the permanent dipole of each packing molecule (each second organic molecule) 27 is negative on the side of the semiconductor layer 10 and is positive on the side of the block insulating film 16, so as to facilitate the injection of charges to be stored and improve the write characteristics. Due to the direction of the permanent dipoles, the energy barrier becomes lower, and charges are easily injected.

Next, improvement of charge retention characteristics is described.

It is considered that erasing or disappearance of positive charges stored in the charge storage molecules 26 occurs due to the following two mechanisms:

(1) Tunneling injection of charges of the opposite sign from electrodes; and (2) Hopping of charges from molecules into electrodes.

First, the mechanism (1) is described. Charges are easily erased by tunneling injection of charges of the opposite sign from the electrodes, because the electric field induced by the charges in the charge storage molecules is strong. Due to the strong electric field, the energy barrier between the molecules and the electrodes becomes lower, and the tunneling probability becomes higher. Therefore, charges are easily erased or disappear from the organic molecular layer.

Figure 8:
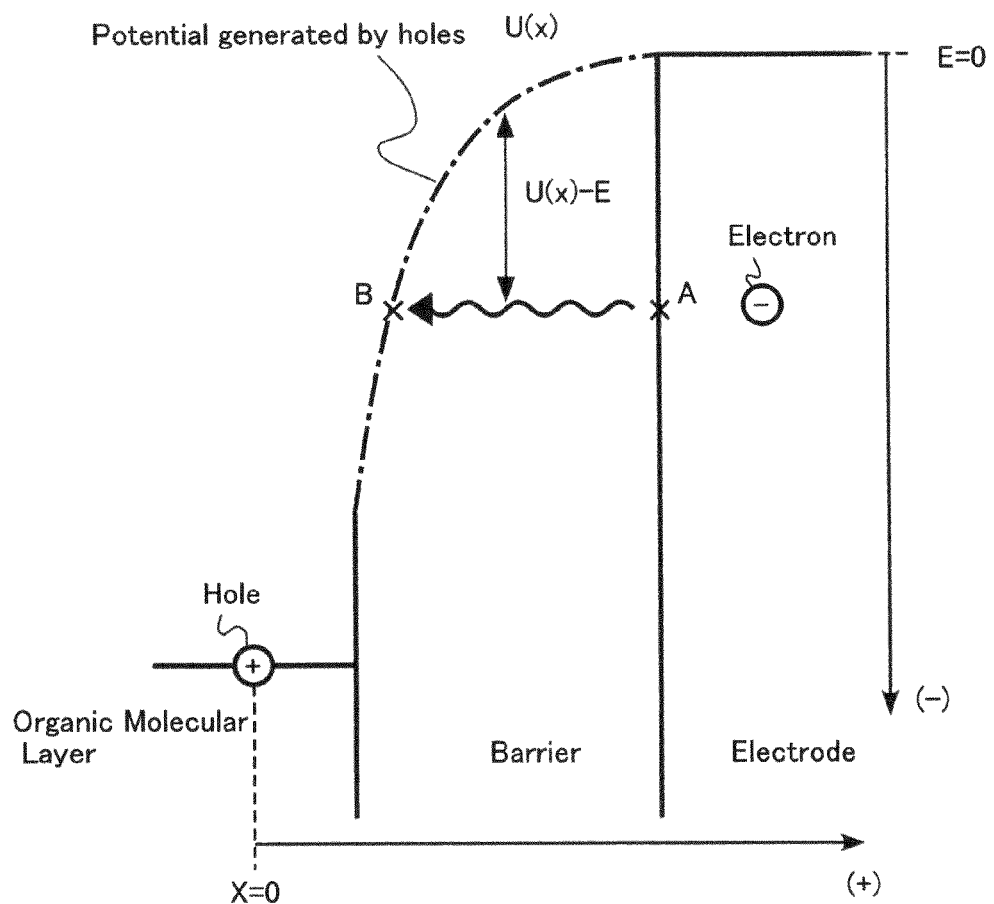
FIG. 8 is a diagram for explaining an effect of the nonvolatile semiconductor memory device of the first embodiment.

FIG. 8 is a diagram for explaining an effect of this embodiment. As shown in FIG. 8, when charges (holes in FIG. 8) exist in an organic molecular layer, carriers (electrons in the drawing) having charges of the opposite sign in the electrodes and the charges in the organic molecular layer attract each other. As a result, the potential barrier between the organic molecular layer and the electrodes becomes lower.

Where the potential barrier is represented by U(x), the probability that charges with an energy E in the electrode tunnel into the organic molecular layer is expressed by the following formula (1):

$$T \propto \exp\left(-\frac{4\pi}{h}\int_A^B \sqrt{2m(U(x)-E)}\,dx\right) \quad \text{[Formula (1)]}$$

Here, π represents the circular constant, h represents the Planck's constant, m represents the effective mass of charges, and A and B are the two points where the potential U(x) has the value of the energy E and serve as the start point (A) and the end point (B) of the tunneling.

As can be seen from the formula (1), the tunneling probability becomes higher, as the distance between A and B (the potential width) becomes shorter and the difference between the potential and the energy (U(x)−E) becomes smaller. The distance between A and B becomes shorter as the change in U(x) becomes larger. Since the change in U(x) corresponds to the electric field, the distance between A and B becomes longer and the tunneling probability becomes lower as the electric field becomes weaker.

Therefore, in restraining erasing of charges due to tunneling and facilitate charge retention, it is essential to weaken the electric field which stored charges felt.

Figure 9:
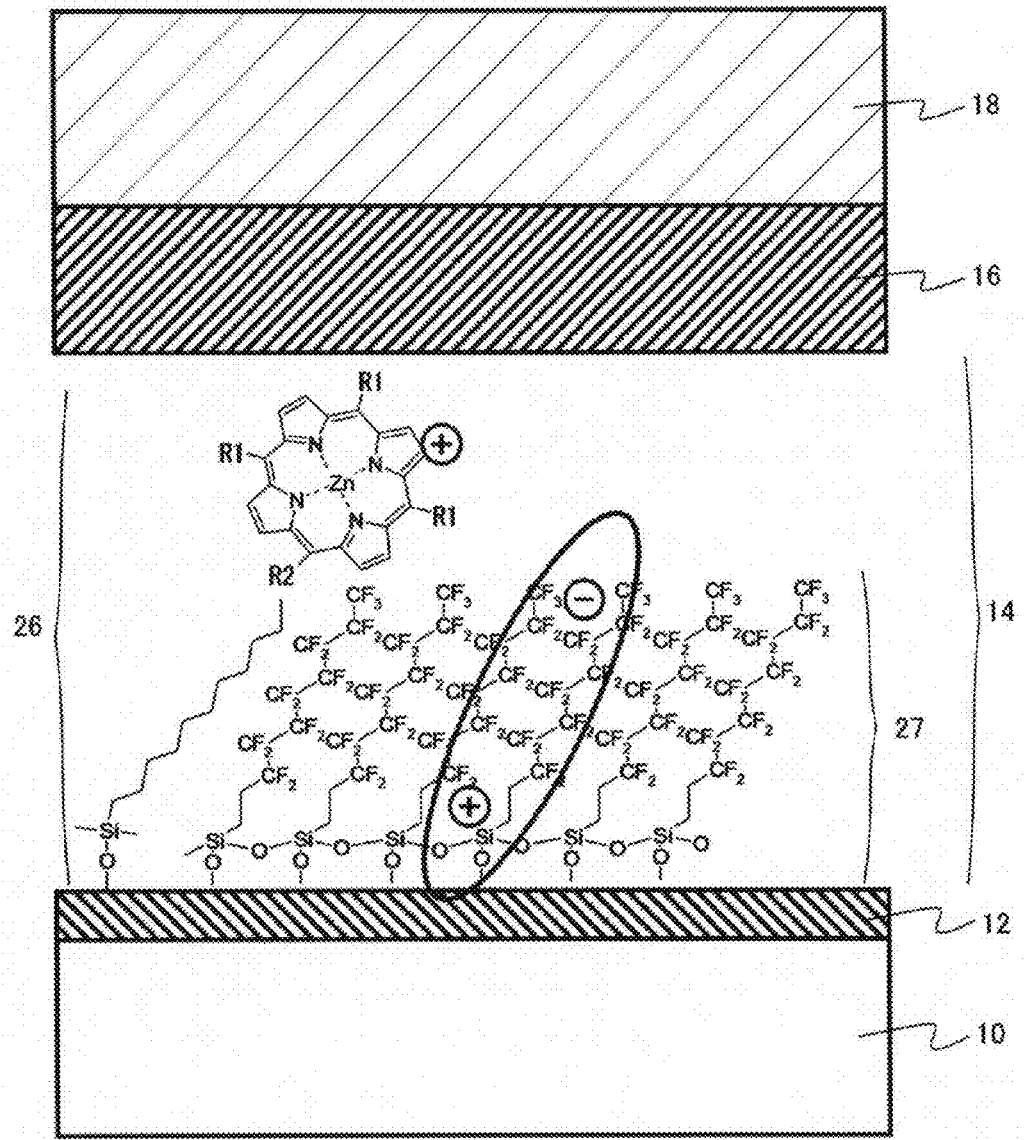
FIG. 9 shows an example of the organic molecules forming the organic molecular layer of the first embodiment, and is a diagram for explaining the effects of those organic molecules.

FIG. 9 shows an example of the organic molecules forming the organic molecular layer of this embodiment, and is a diagram for explaining the effects of those organic molecules.

FIG. 9 shows the charge storage molecules 26 forming the charge storage layer 14, and the packing molecules 27 each having a fluoroalkyl group having fluorine atoms (F) as electron-withdrawing substituents bound to an alkyl main chain. A case where the porphyrin of the charge storage molecule 26 functions as the charge storage portions and stores positive charges is now described.

The packing molecules 27 are straight chains, and have a large intermolecular force in between. Accordingly, the packing molecules 27 form a self-assembled film that is dense as a whole. The orientation of the packing molecules 27 is fixed by the chemisorption onto the tunnel insulating film 12.

Therefore, the orientation of the permanent dipoles formed by the packing molecular film is positive on the side of the semiconductor layer 10, and is negative on the side of the block insulating film 16. As a result, the electric field to be felt by the positive charges stored in the charge storage molecules 26 are weakened by the permanent dipoles formed by the packing molecules 27.

Figure 10:
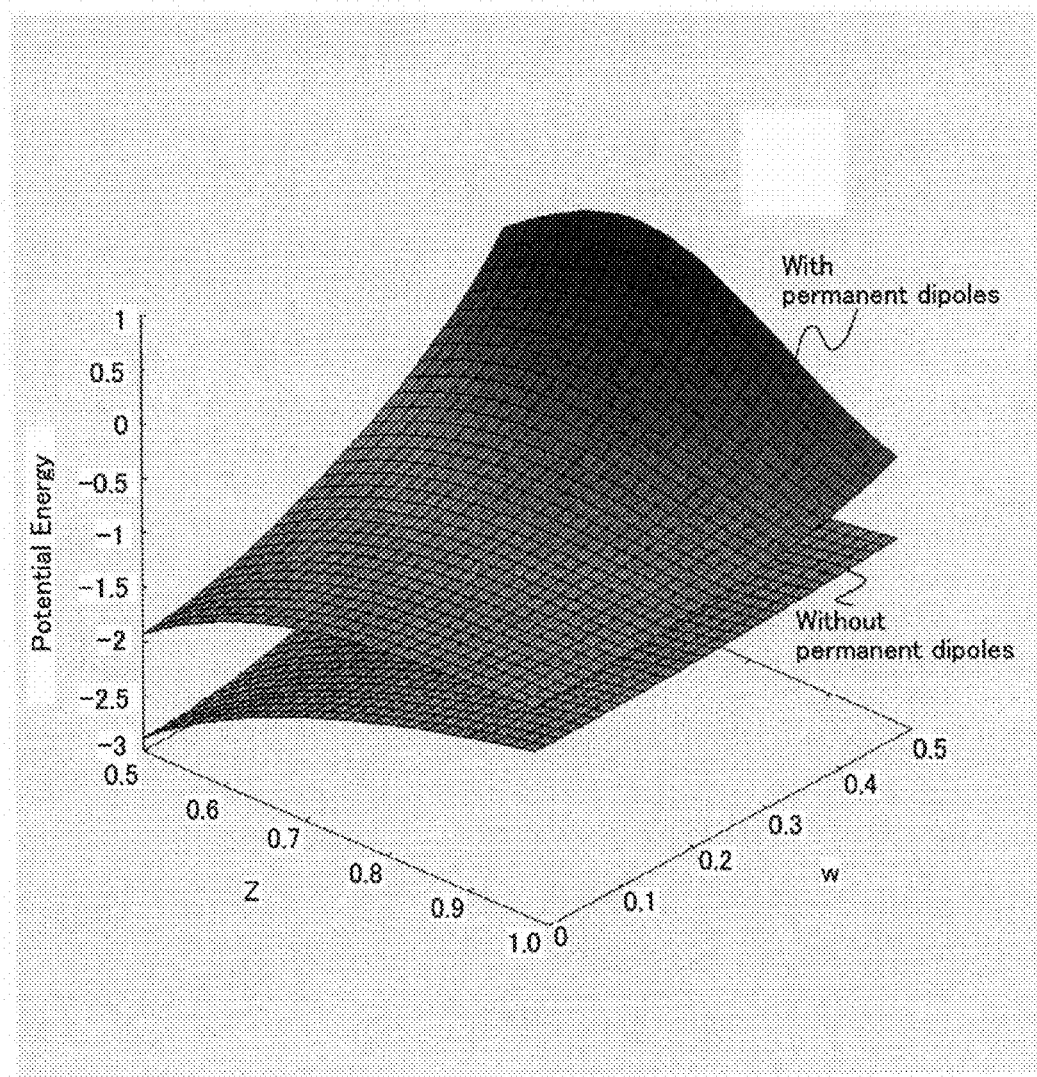
FIG. 10 is a diagram for explaining an effect of the nonvolatile semiconductor memory device of the first embodiment.
Figure 11:
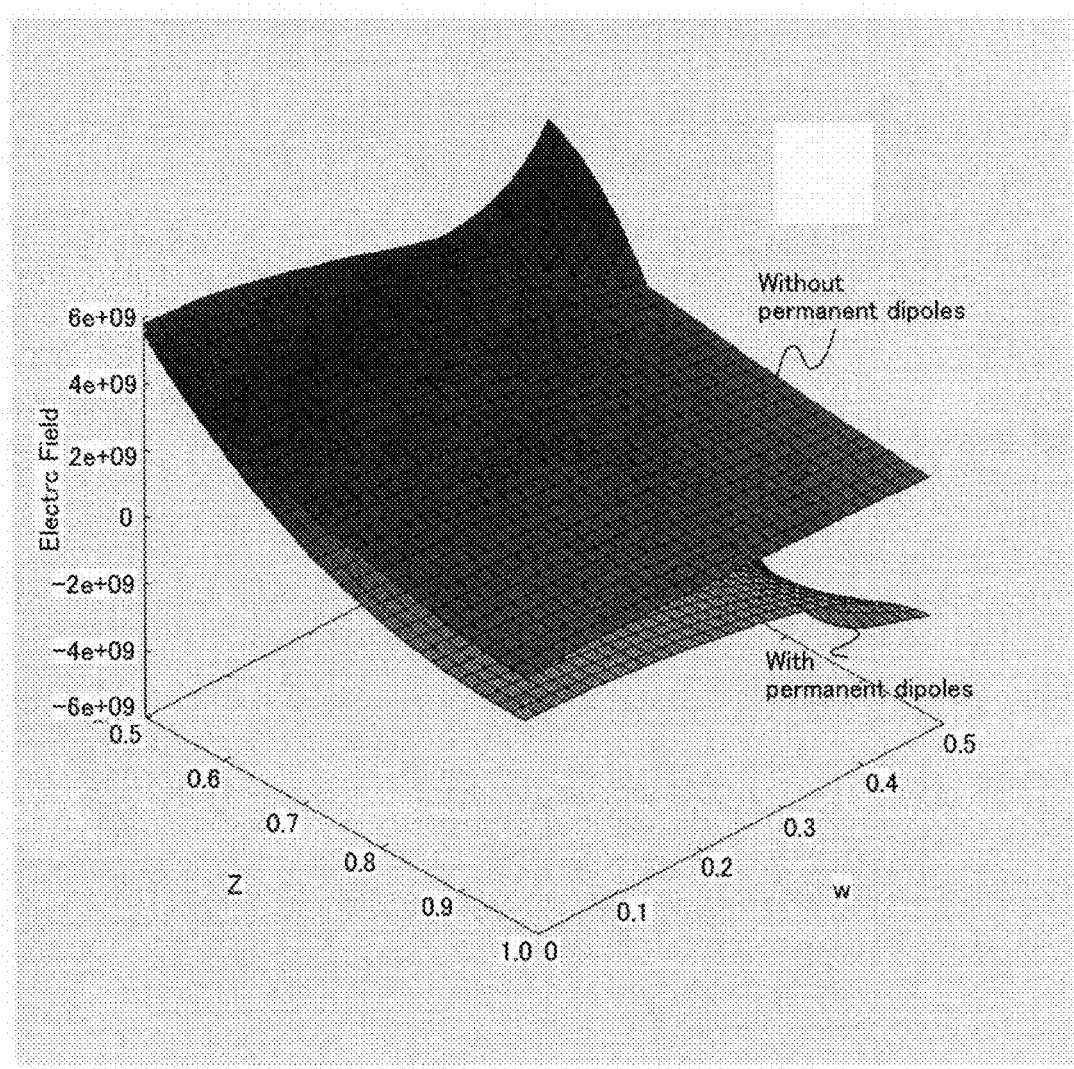
FIG. 11 is a diagram for explaining an effect of the nonvolatile semiconductor memory device of the first embodiment.
Figure 12:
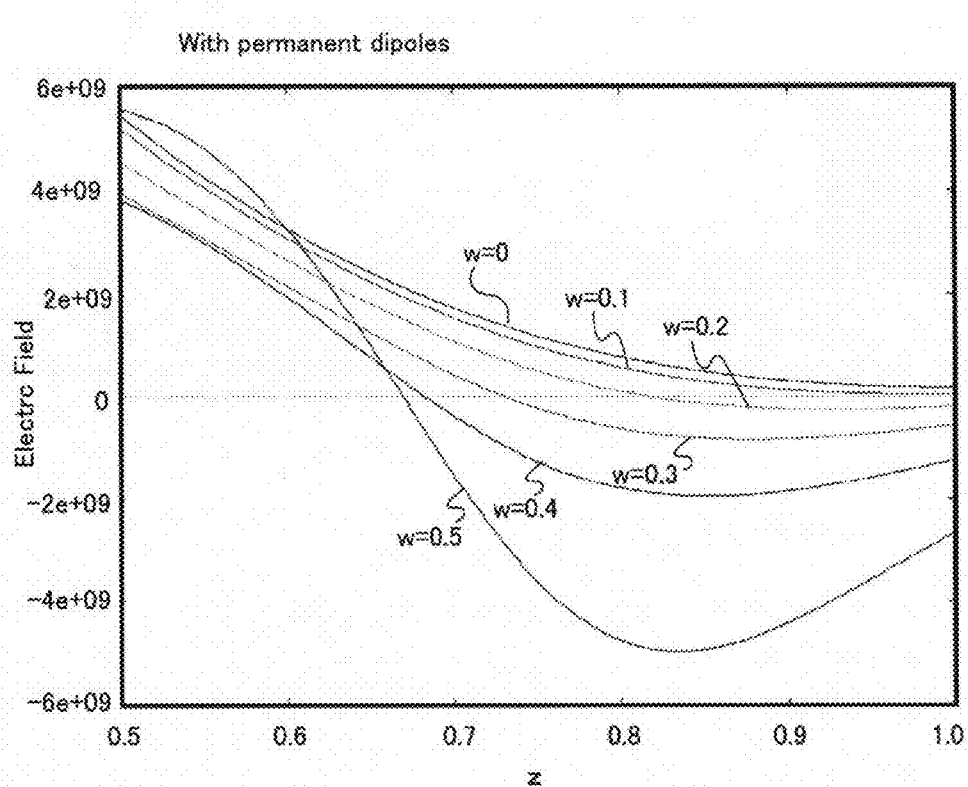
FIG. 12 is a diagram for explaining an effect of the nonvolatile semiconductor memory device of the first embodiment.

FIGS. 10, 11, and 12 are diagrams for explaining the above described effects of this embodiment. In a case where positive charges were stored in the charge storage molecules 26, simulations were performed to determine how the relationship between the distance from the charges in the charge storage molecules 26 and the strength of the potential varies depending on whether molecules having permanent dipoles exist or whether permanent dipoles exist near the charge storage molecules 26. The results of the simulations are shown in the drawings.

First, on the assumption that molecules are arranged in a two-dimensional square lattice (the lattice constant: a), the z-axis is set in the length direction of the molecules. The center of each molecule in the length direction is set as z=0, and a charge Q enters this location. A permanent dipole D is located in the position of z=+c/−c in each molecule, and is oriented in the direction of the electric field generated by the charges Q. That is, each of the permanent dipoles D is oriented in a stable direction.

As a result, the potential $U_Q$ generated by the charge Q can be expressed by the following formula (2):

$$U_Q = -\frac{1}{4\pi\varepsilon}\frac{Q}{r} = -\frac{1}{4\pi\varepsilon}\frac{Q}{\sqrt{z^2+w^2}} \quad \text{[Formula (2)]}$$

Where the permanent dipoles D exist, the potential $U_{Total}$ of the entire system can be expressed by the following formula (3):

$$U_{Total} = U_Q + U_{nn} + U_{sn} \quad \text{[Formula (3)]}$$

Here, some permanent dipoles are located in the nearest neighbor lattice A, and some other permanent dipoles are located in the second nearest neighbor lattice B. The potentials generated by the respective permanent dipoles are represented by $U_{nn}$ and $U_{sn}$. The change in potential due to the existence or non-existence of the permanent dipoles is determined by comparing the formula (2) and the formula (3). In the following, the respective terms of the formula (2) and the formula (3) are determined.

The coordinates of the permanent dipoles D in the nearest neighbor lattice are A=(a, 0, c), (a, 0, −c), (0, a, c), (0, a, −c), (−a, 0, c), (−a, 0, −c), (0, −a, c), and (0, −a, −c). The second nearest coordinates are B=(a, a, c), (a, a, −c), (−a, a, c), (−a, a, −c), (−a, −a, c), (−a, −a, −c), (a, −a, c), and (a, −a, −c).

Now, the change in the electric field R=(0, 0, z) due to the existence or non-existence of permanent dipoles is calculated.

The potential U generated by a permanent dipole can be expressed by the following formulas (4) through (8):

$$U = -\frac{1}{4\pi\varepsilon}\frac{\vec{D}\cdot\vec{r}}{r^3} \quad \text{[Formula (4)]}$$

$$\vec{D} = \frac{-D}{\sqrt{a^2+c^2}}\vec{X} \quad \text{[Formula (5)]}$$

$$\vec{r} = X - R \quad \text{[Formula (6)]}$$

$$\vec{X} = A, B \quad \text{[Formula (7)]}$$

$$R = \left(\frac{w}{\sqrt{2}}, \frac{w}{\sqrt{2}}, z\right) \quad \text{[Formula (8)]}$$

As for the nearest neighbor lattice A=(a, 0, c), (a, 0, −c), (0, a, c), (0, a, −c), the distance r from Q can be expressed by the following formulas (9) and (10):

$$\vec{r} = A - R \quad \text{[Formula (9)]}$$

$$|\vec{r}| = r = \sqrt{a^2 - \sqrt{2}\,aw + w^2 + (\pm c - z)^2} \quad \text{[Formula (10)]}$$

A permanent dipole can be expressed by the following formulas (11) and (12):

$$\vec{D} = \frac{D}{\sqrt{a^2 + c^2}} A \quad \text{[Formula (11)]}$$

$$|\vec{D}| = D \quad \text{[Formula (12)]}$$

Accordingly, the following formula (13) is formed:

$$\vec{D} \cdot \vec{r} = \frac{D}{\sqrt{a^2 + c^2}}(|A|^2 - A \cdot R) = \quad \text{[Formula (13)]}$$

$$\frac{D}{\sqrt{a^2 + c^2}}\left(a^2 + c^2 - \frac{aw}{\sqrt{2}} \mp cz\right)$$

That is, the following formulas (14) and (15) are formed at (a, 0, c) and (0, a, c):

$$r = \sqrt{a^2 - \sqrt{2}\,aw + w^2 + (c - z)^2} \quad \text{[Formula (14)]}$$

$$\vec{D} \cdot \vec{r} = \frac{D}{\sqrt{a^2 + c^2}}\left(a^2 + c^2 - \frac{aw}{\sqrt{2}} - cz\right) \quad \text{[Formula (15)]}$$

At (a, 0, −c) and (0, a, −c), the following formulas (16) and (17) are formed:

$$r = \sqrt{a^2 - \sqrt{2}\,aw + w^2 + (c + z)^2} \quad \text{[Formula (16)]}$$

$$\vec{D} \cdot \vec{r} = \frac{D}{\sqrt{a^2 + c^2}}\left(a^2 + c^2 - \frac{aw}{\sqrt{2}} + cz\right) \quad \text{[Formula (17)]}$$

Accordingly, the sum of the four potentials is expressed by the following formula (18):

$$U_{nn} = \frac{D}{2\pi\varepsilon\sqrt{a^2 + c^2}}\left[\frac{\left(a^2 + c^2 - \frac{aw}{\sqrt{2}} - cz\right)}{\left(a^2 - \sqrt{2}\,aw + w^2 + (c - z)^2\right)^{3/2}} + \frac{\left(a^2 + c^2 - \frac{aw}{\sqrt{2}} + cz\right)}{\left(a^2 - \sqrt{2}\,aw + w^2 + (c + z)^2\right)^{3/2}}\right] \quad \text{[Formula (18)]}$$

Likewise, as for A=(−a, 0, c), (−a, 0, −c), (0, −a, c), and (0, −a, −c), the following formulas (19) and (20) are formed at (−a, 0, c) and (0, −a, c):

$$r = \sqrt{a^2 + \sqrt{2}\,aw + w^2 + (c - z)^2} \quad \text{[Formula (19)]}$$

$$\vec{D} \cdot \vec{r} = \frac{D}{\sqrt{a^2 + c^2}}\left(a^2 + c^2 + \frac{aw}{\sqrt{2}} - cz\right) \quad \text{[Formula (20)]}$$

At (−a, 0, −c) and (0, −a, −c), the following formulas (21) and (22) are formed:

$$r = \sqrt{a^2 + \sqrt{2}\,aw + w^2 + (c + z)^2} \quad \text{[Formula (21)]}$$

$$\vec{D} \cdot \vec{r} = \frac{D}{\sqrt{a^2 + c^2}}\left(a^2 + c^2 + \frac{aw}{\sqrt{2}} + cz\right) \quad \text{[Formula (22)]}$$

Accordingly, the sum of the four potentials is expressed by the following formula (23):

$$U_{nn} = \frac{D}{2\pi\varepsilon\sqrt{a^2 + c^2}}\left[\frac{\left(a^2 + c^2 + \frac{aw}{\sqrt{2}} - cz\right)}{\left(a^2 + \sqrt{2}\,aw + w^2 + (c - z)^2\right)^{3/2}} + \frac{\left(a^2 + c^2 + \frac{aw}{\sqrt{2}} + cz\right)}{\left(a^2 + \sqrt{2}\,aw + w^2 + (c + z)^2\right)^{3/2}}\right] \quad \text{[Formula (23)]}$$

According to the formulas (18) and (23), the potential $U_{nn}$ generated by the nearest neighbor lattice can be expressed by the following formula (24):

$$U_{nn} = \frac{D}{2\pi\varepsilon\sqrt{a^2 + c^2}}\left[\frac{\left(a^2 + c^2 - \frac{aw}{\sqrt{2}} - cz\right)}{\left(a^2 - \sqrt{2}\,aw + w^2 + (c - z)^2\right)^{3/2}} + \frac{\left(a^2 + c^2 - \frac{aw}{\sqrt{2}} + cz\right)}{\left(a^2 - \sqrt{2}\,aw + w^2 + (c + z)^2\right)^{3/2}} + \frac{\left(a^2 + c^2 + \frac{aw}{\sqrt{2}} - cz\right)}{\left(a^2 + \sqrt{2}\,aw + w^2 + (c - z)^2\right)^{3/2}} + \frac{\left(a^2 + c^2 + \frac{aw}{\sqrt{2}} + cz\right)}{\left(a^2 + \sqrt{2}\,aw + w^2 + (c + z)^2\right)^{3/2}}\right] \quad \text{[Formula (24)]}$$

Next, the second nearest neighbor lattice B is described.

At B=(a, a, c) and (a, a, −c), the distance r from Q is expressed by the following formulas (25) and (26):

$$\vec{r} = B - R \quad \text{[Formula (25)]}$$

$$r = \sqrt{2\left(a - \frac{w}{\sqrt{2}}\right)^2 + (\pm c - z)^2} = \quad \text{[Formula (26)]}$$

$$\sqrt{2a^2 + w^2 - 2\sqrt{2}\,aw + (\pm c - z)^2}$$

The permanent dipole vector is expressed by the following formulas (27) and (28):

$$\vec{D} = \frac{-D}{\sqrt{2a^2+c^2}} B \quad \text{[Formula (27)]}$$

$$|\vec{D}| = D \quad \text{[Formula (28)]}$$

Accordingly, the following formula (29) is formed:

$$\vec{D}\cdot\vec{r} = \frac{-D}{\sqrt{2a^2+c^2}}(|B|^2 - B\cdot R) = \frac{-D}{\sqrt{a^2+c^2}}(2a^2+c^2-\sqrt{2}\,aw \mp cz) \quad \text{[Formula (29)]}$$

That is, the following formulas (30) and (31) are formed at (a, a, c):

$$r = \sqrt{2a^2+w^2-2\sqrt{2}\,aw+(c-z)^2} \quad \text{[Formula (30)]}$$

$$\vec{D}\cdot\vec{r} = \frac{-D}{\sqrt{2a^2+c^2}}(2a^2+c^2-\sqrt{2}\,aw-cz) \quad \text{[Formula (31)]}$$

Also, the following formulas (32) and (33) are formed at (a, a, −c):

$$r = \sqrt{2a^2+w^2-2\sqrt{2}\,aw+(c+z)^2} \quad \text{[Formula (32)]}$$

$$\vec{D}\cdot\vec{r} = \frac{-D}{\sqrt{2a^2+c^2}}(2a^2+c^2-\sqrt{2}\,aw+cz) \quad \text{[Formula (33)]}$$

Accordingly, the sum $U_{sn}$ of the two potentials is expressed by the following formula (34):

$$U_{sn} = \frac{D}{4\pi\varepsilon\sqrt{2a^2+c^2}} \left[ \frac{(2a^2+c^2-\sqrt{2}\,aw-cz)}{(2a^2+w^2-2\sqrt{2}\,aw+(c-z)^2)^{3/2}} + \frac{(2a^2+c^2-\sqrt{2}\,aw+cz)}{(2a^2+w^2-2\sqrt{2}\,aw+(c+z)^2)^{3/2}} \right] \quad \text{[Formula (34)]}$$

Likewise, as for the second nearest neighbor lattice B=(a, −a, c), (a, −a, −c), (−a, a, c), and (−a, a, −c), the distance r from Q is expressed by the following formulas (35) and (36):

$$\vec{r} = B - R \quad \text{[Formula (35)]}$$

$$r = \sqrt{\left(a-\frac{w}{\sqrt{2}}\right)^2 + \left(-a-\frac{w}{\sqrt{2}}\right)^2 + (\pm c-z)^2} = \sqrt{2a^2+w^2+(\pm c-z)^2} \quad \text{[Formula (36)]}$$

The permanent dipole vector is expressed by the following formulas (37) and (38):

$$\vec{D} = \frac{-D}{\sqrt{2a^2+c^2}} B \quad \text{[Formula (37)]}$$

$$|\vec{D}| = D \quad \text{[Formula (38)]}$$

Accordingly, the following formula (39) is formed:

$$\vec{D}\cdot\vec{r} = \frac{-D}{\sqrt{2a^2+c^2}}(|B|^2 - B\cdot R) = \frac{-D}{\sqrt{a^2+c^2}}(2a^2+c^2 \mp cz) \quad \text{[Formula (39)]}$$

That is, the following formulas (40) and (41) are formed at (a, −a, c) and (−a, a, c):

$$r = \sqrt{2a^2+w^2+(c-z)^2} \quad \text{[Formula (40)]}$$

$$\vec{D}\cdot\vec{r} = \frac{-D}{\sqrt{2a^2+c^2}}(2a^2+c^2-cz) \quad \text{[Formula (41)]}$$

Also, the following formulas (42) and (43) are formed at (a, −a, −c) and (−a, a, −c):

$$r = \sqrt{2a^2+w^2+(c+z)^2} \quad \text{[Formula (42)]}$$

$$\vec{D}\cdot\vec{r} = \frac{-D}{\sqrt{2a^2+c^2}}(2a^2+c^2+cz) \quad \text{[Formula (43)]}$$

Accordingly, the sum $U_{sn}$ of the four potentials is expressed by the following formula (44):

$$U_{sn} = \frac{D}{2\pi\varepsilon\sqrt{2a^2+c^2}} \left[ \frac{(2a^2+c^2-cz)}{(2a^2+w^2+(c-z)^2)^{3/2}} + \frac{(2a^2+c^2+cz)}{(2a^2+w^2+(c+z)^2)^{3/2}} \right] \quad \text{[Formula (44)]}$$

Likewise, as for the second nearest neighbor lattice B=(−a, −a, c) and (−a, −a, −c), the distance r from Q is expressed by the following formulas (45) and (46):

$$\vec{r} = B - R \quad \text{[Formula (45)]}$$

$$r = \sqrt{2\left(-a-\frac{w}{\sqrt{2}}\right)^2 + (\pm c-z)^2} = \sqrt{2a^2+w^2-2\sqrt{2}\,aw+(\pm c-z)^2} \quad \text{[Formula (46)]}$$

The permanent dipole vector is expressed by the following formulas (47) and (48):

$$\vec{D} = \frac{-D}{\sqrt{2a^2 + c^2}} B \qquad \text{[Formula (47)]}$$

$$|\vec{D}| = D \qquad \text{[Formula (48)]}$$

Accordingly, the following formula (49) is formed:

$$\vec{D} \cdot \vec{r} = \frac{-D}{\sqrt{2a^2 + c^2}}(|B|^2 - B \cdot R) = \qquad \text{[Formula (49)]}$$

$$\frac{-D}{\sqrt{a^2 + c^2}}(2a^2 + c^2 + \sqrt{2}\,aw \mp cz)$$

That is, the following formulas (50) and (51) are formed at $(-a, -a, c)$.

$$r = \sqrt{2a^2 + w^2 - 2\sqrt{2}\,aw + (c-z)^2} \qquad \text{[Formula (50)]}$$

$$\vec{D} \cdot \vec{r} = \frac{-D}{\sqrt{2a^2 + c^2}}(2a^2 + c^2 + \sqrt{2}\,aw - cz) \qquad \text{[Formula (51)]}$$

Also, the following formulas (52) and (53) are formed at $(-a, -a, -c)$:

$$r = \sqrt{2a^2 + w^2 - 2\sqrt{2}\,aw + (c+z)^2} \qquad \text{[Formula (52)]}$$

$$\vec{D} \cdot \vec{r} = \frac{-D}{\sqrt{2a^2 + c^2}}(2a^2 + c^2 + \sqrt{2}\,aw + cz) \qquad \text{[Formula (53)]}$$

Accordingly, the sum $U_{sn}$ of the two potentials is expressed by the following formula (54):

$$U_{sn} = \frac{D}{4\pi\varepsilon\sqrt{2a^2 + c^2}}\left[\frac{(2a^2 + c^2 + \sqrt{2}\,aw - cz)}{(2a^2 + w^2 - 2\sqrt{2}\,aw + (c-z)^2)^{3/2}} + \frac{(2a^2 + c^2 + \sqrt{2}\,aw + cz)}{(2a^2 + w^2 - 2\sqrt{2}\,aw + (c+z)^2)^{3/2}}\right] \qquad \text{[Formula (54)]}$$

As can be seen from the formulas (34), (44), and (54), the potential $U_{sn}$ generated by the second nearest neighbor lattices is expressed by the following formula (55):

$$U_{sn} = \frac{D}{4\pi\varepsilon\sqrt{2a^2 + c^2}} \left[ \begin{array}{l} \frac{(2a^2 + c^2 - \sqrt{2}\,aw - cz)}{(2a^2 + w^2 - 2\sqrt{2}\,aw + (c-z)^2)^{3/2}} + \frac{(2a^2 + c^2 - \sqrt{2}\,aw + cz)}{(2a^2 + w^2 - 2\sqrt{2}\,aw + (c+z)^2)^{3/2}} + \\ \frac{2(2a^2 + c^2 - cz)}{(2a^2 + w^2 + (c-z)^2)^{3/2}} + \frac{2(2a^2 + c^2 + cz)}{(2a^2 + w^2 + (c+z)^2)^{3/2}} + \\ \frac{(2a^2 + c^2 + \sqrt{2}\,aw - cz)}{(2a^2 + w^2 - 2\sqrt{2}\,aw + (c-z)^2)^{3/2}} + \frac{(2a^2 + c^2 + \sqrt{2}\,aw + cz)}{(2a^2 + w^2 - 2\sqrt{2}\,aw + (c+z)^2)^{3/2}} \end{array} \right] \qquad \text{[Formula (55)]}$$

Here, the followings are hypothetically set. Where Q is a hole, $Q = 1.60 \times 10^{-19}$ C. Each permanent dipole is $CH_3F$, and is 1.85 debyes (1 debye = $3.336 \times 10^{-30}$ Cm). For example, where C—F bonds are used, $D = 6.17 \times 10^{-30}$ Cm. Since the height of molecules such as the charge storage molecules 26 shown in FIG. 9 is approximately 2 nm, c=0.7 nm, which is less than half the height, is hypothetically set. Since the lattice constant of Si is 0.5 nm, the lattice constant a is a=0.6 nm. With this size, there is nothing to polarize, other than the molecules, and therefore, the relative permittivity is 1. Accordingly, the permittivity is $\varepsilon = 8.85419 \times 10^{-12}$ C$^2$/Nm$^2$.

After the above values are hypothetically set, the potential energies are compared, with the formulas (1) and (2) being developed in the w plane. The comparison results are shown in FIG. 10. Electric fields are obtained by differentiating the potentials. FIG. 11 shows the results obtained by differentiating the formulas (1) and (2). FIG. 12 shows the relationship between potential energy and z when w is changed from 0 to 0.5 in a case where permanent dipoles are provided. As the results, electric fields are weakened where permanent dipoles exist.

Figure 13:
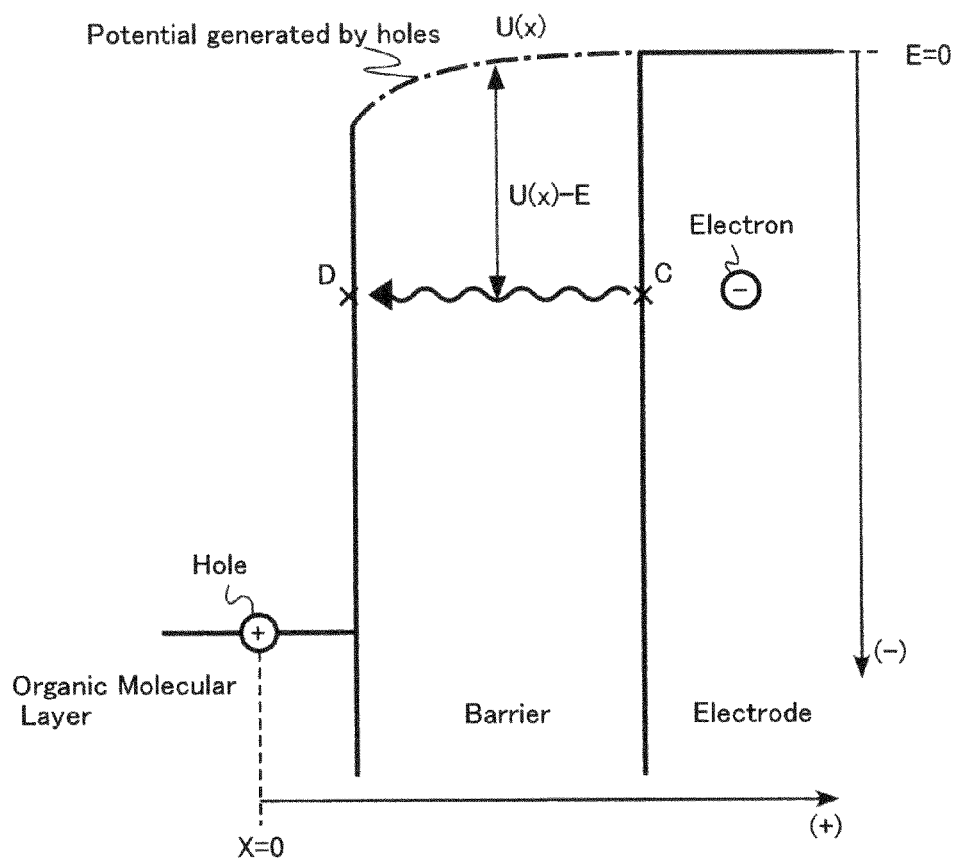
FIG. 13 is a diagram for explaining an effect of the nonvolatile semiconductor memory device of the first embodiment.

FIG. 13 is a diagram for explaining the effects of this embodiment. This is a diagram more schematically showing the effects illustrated in FIGS. 10 through 12. FIG. 13 shows a potential barrier change indicating that the electric field to be felt by the positive charges stored in the charge storage molecules 26 is changed by the permanent dipoles of the peripheral packing molecules 27.

In a case where charges having the same energy E as that in FIG. 8 tunnel from the electrodes into the organic molecular layer, the charges need to pass through the start point C and the end point D of the tunneling. The distance between C and D is longer than the distance between A and B in FIG. 8. Moreover, the difference between the potential and the energy $(U(x)-E)$ is larger than that in FIG. 8. Accordingly, the tunneling probability becomes lower than that in FIG. 8. Thus, the charge retention time becomes longer. It is considered that this effect also works on the above described mechanism (2).

As described above, in a case where positive charges are stored in the charge storage molecules, the packing molecules (the second organic molecules) 27 are preferably such molecules that the overall orientation of the permanent dipoles is positive on the side of the semiconductor layer 10 and is negative on the side of the block insulating film 16, so as to increase the charge retention time.

Meanwhile, when the potential barrier becomes lower, the tunneling is restrained. Furthermore, when the polarization energy becomes larger, erasing due to escape of charges from the molecules to the electrodes by hopping can be restrained. However, to increase the polarization energy, the relative permittivity needs to be increased.

If very high relative permittivity is given to the charge storage molecules 26 and the packing molecules 27, the effect to improve the write characteristics is reduced. Therefore, in a case where positive charges are stored in the charge storage molecules, the packing molecules (the second organic molecules) 27 are preferably such molecules that the relative permittivity is approximately 3, for example, and the overall orientation of the permanent dipoles is positive on the side of the semiconductor layer 10 and is negative on the side of the block insulating film 16, so as to improve the write characteristics and increase the charge retention time at the same time. This condition can be satisfied by selecting alkyl halide chains.

Next, a method of manufacturing the nonvolatile semiconductor memory device according to this embodiment is described.

For example, the tunnel insulating film 12 is formed on the semiconductor layer 10 made of single-crystal silicon. If the tunnel insulating film 12 is made of silicon oxide, the tunnel insulating film 12 can be formed by introducing a silicon substrate into a thermal oxidation furnace, and forcibly oxidizing the silicon substrate.

Alternatively, the tunnel insulating film 12 can be formed with a film forming device that performs atomic layer deposition (ALD) or sputtering. When film formation is performed, the formed insulating film is preferably annealed with a rapid thermal annealing (RTA) device.

The charge storage layer (the organic molecular layer) 14 is then formed on the tunnel insulating film 12.

When the charge storage layer 14 is formed, the following methods can be used, for example. When the charge storage molecules 26 and the packing molecules 27 are formed on the tunnel insulating film 12, the process of adsorbing the charge storage molecules 26 is first performed, and the process of adsorbing the packing molecules 27 is then performed, according to one method. According to another method, the process of adsorbing the charge storage molecules 26 and the process of adsorbing the packing molecules 27 are performed at the same time.

If the packing molecules 27 are first adsorbed, the adsorption sites for the charge storage molecules 26 are occupied by the packing molecules 27, and desired characteristics cannot be obtained. So the process of adsorbing the packing molecules 27 is not performed before the process of adsorbing the charge storage molecules 26 is performed.

The following is a description of an example case where the process of adsorbing the charge storage molecules 26 is first performed, followed by the process of adsorbing the packing molecules 27.

First, the surface of the tunnel insulating film 12 to be the foundation of the formation of the charge storage layer 14 is cleaned. The cleaning can be used wet cleaning (immersion for a mixture of sulfuric acid and hydrogen peroxide water (the mixing ratio is 2:1, for example)), or dry cleaning (irradiation of ultraviolet light to the surface, for example).

The charge storage molecules 26 each including a charge storage portion 26b, a connecting portion 26c such as an alkyl chain or an alkyl halide chain, and an end group 26a such as a silanol group are prepared. The surface of the cleaned tunnel insulating film 12 is immersed in a solution formed by dissolving the charge storage molecules 26 in a solvent. The end groups 26a such as silanol groups are then made to react with the surface of the tunnel insulating film 12.

The charge storage molecules 26 should be highly soluble in the solvent, and examples of such solvents include organic solvents such as acetone, toluene, ethanol, methanol, hexane, cyclohexanone, and isopropyl alcohol. In some cases, the charge storage molecules 26 are soluble in water. In such cases, water can be used as the solvent.

If the concentration of the charge storage molecules 26 to be dissolved in the solvent is too low, the immersion time becomes longer. If the concentration is too high, there is an increase in adsorbed unnecessary molecules that need to be removed by a rinsing operation. Therefore, it is preferable to adjust the concentration to an appropriate value. For example, the concentration is preferably 1 to 100 mM.

At this point, a catalyst may be added, so as to increase the reactivity between the cleaned surface of the tunnel insulating film 12 and the end groups of the charge storage molecules 26. The catalyst may be acetic acid, formic acid, propionic acid, trifluoroacetic acid, triethylamine, ammonia, or the like, which is soluble in the solvent.

If the addition of the catalyst is too large in amount, the charge storage molecules 26 have a self-reaction in the solvent, causing a side reaction such as polymerization. Therefore, the addition of the catalyst is preferably small in amount. Preferably, the addition of the catalyst is 3% or less with respect to the volume of the solution. The time during which the surface of the insulating film is immersed in the solution formed by dissolving the charge storage molecules 26 is preferably such a period of time as to allow a sufficient reaction, or more preferably, one minute or longer.

After that, the surface of the insulating film is immersed in the used solvent, and is rinsed with the use of a ultrasonic cleaner. To rinse off physically-adsorbed excess organic matter, this operation is preferably repeated at least twice, with the solvent being replaced with a new one.

The surface of the insulating film is then immersed in ethanol, and is also rinsed with the use of a ultrasonic cleaner. As a result, the charge storage molecules 26 are adsorbed to the surface of the tunnel insulating film 12.

The packing molecules 27 each including a connecting portion 27c such as an alkyl chain or an alkyl halide chain and an end group 27a such as a silanol group are then prepared. The surface of the cleaned tunnel insulating film 12 having the charge storage molecules 26 partially adsorbed thereto is immersed in a solution formed by dissolving the packing molecules 27 in a solvent. The end groups 27a of the packing molecules 27 are then made to react with portions of the surface of the tunnel insulating film 12, with the charge storage molecules 26 being not adsorbed to the portions.

The packing molecules 27 should be highly soluble in the solvent, and examples of such solvents include organic solvents such as acetone, toluene, ethanol, methanol, hexane, cyclohexanone, and isopropyl alcohol. In some cases, the packing molecules 27 are soluble in water. In such cases, water can be used as the solvent.

If the concentration of the packing molecules 27 to be dissolved in the solvent is too low, the reaction time becomes longer. If the concentration is too high, there is an increase in adsorbed excess molecules that need to be removed by a rinsing operation. Therefore, it is preferable to adjust the concentration to an appropriate value. For example, the concentration is preferably 1 to 100 mM.

At this point, a catalyst may be added, so as to increase the reactivity between the cleaned surface of the tunnel insulating film 12 and the end groups of the packing molecules 27. The catalyst may be acetic acid, formic acid, propionic acid, trifluoroacetic acid, triethylamine, ammonia, or the like, which is soluble in the solvent.

If the addition of the catalyst is too large in amount, the packing molecules 27 have a self-reaction in the solvent, causing a side reaction such as polymerization. Therefore, the addition of the catalyst is preferably small in amount. Preferably, the addition of the catalyst is 3% or less with respect to the volume of the solution. The time during which the surface of the insulating film is immersed in the solution formed by dissolving the packing molecules 27 is preferably such a period of time as to allow a sufficient reaction, or more preferably, one minute or longer.

After that, the surface of the insulating film is immersed in the used solvent, and is rinsed with the use of a ultrasonic cleaner. To rinse off physically-adsorbed excess packing molecules 27, this operation is preferably repeated at least twice, with the solvent being replaced with a new one.

The surface of the insulating film is then immersed in ethanol, and is also rinsed with the use of a ultrasonic cleaner. As a result, the packing molecules 27 are also adsorbed to the surface of the tunnel insulating film 12.

After that, the solvent is removed by a nitrogen air gun or a spin coater, and drying is performed. As a result, the charge storage layer 14 formed with the charge storage molecules 26 and the packing molecules 27 is formed on the tunnel insulating film 12.

After that, a hafnium oxide film, for example, is deposited on the charge storage layer (the organic molecular layer) 14, to form the block insulating film 16.

The block insulating film 16 can be formed by a film forming device that performs ALD (Atomic Layer Deposition) or sputtering or the like. The film forming device is preferably a low-damaging film forming device with which the charge storage layer 14 formed with organic molecules is not degraded, and is preferably a thermal-type ALD device, for example. The formed insulating film is preferably annealed with a rapid thermal annealing (RTA) device, so as to increase the atom density in the film.

An impurity-doped polycrystalline silicon film is then formed by CVD (Chemical Vapor Deposition), for example, to form the control gate electrode 18. Patterning is then performed on the stacked films, to form a gate electrode structure.

After that, for example, with the control gate electrode 18 serving as a mask, p-type impurity ions are implanted, to form the source region 20 and the drain region 22. In this manner, the nonvolatile semiconductor memory device illustrated in FIG. 1 can be manufactured.

As described above, according to this embodiment, charge storage molecules and packing molecules are used in the charge storage layer. Accordingly, a nonvolatile semiconductor memory device that has excellent write characteristics and charge retention characteristics can be realized.

Second Embodiment

A nonvolatile semiconductor memory device of this embodiment is the same as that of the first embodiment, except that the transistors of the memory cells are n-type transistors having electrons as carriers. Therefore, the same explanations as those in the first embodiment will not be repeated.

Figure 14:
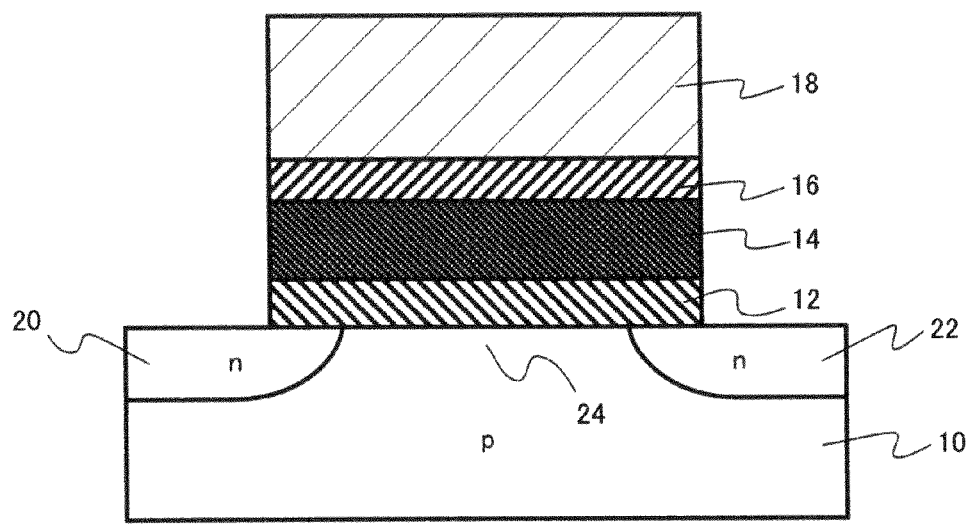
FIG. 14 is a cross-sectional view of a memory cell portion of a nonvolatile semiconductor memory device according to a second embodiment.

FIG. 14 is a cross-sectional view of a memory cell portion of the nonvolatile semiconductor memory device according to this embodiment.

The memory cells are formed on a p-type single-crystal silicon semiconductor layer 10 containing p-type impurities, for example. A tunnel insulating film 12 is formed on the silicon semiconductor layer 10, a charge storage layer 14 is formed on the tunnel insulating film 12, a block insulating film 16 is formed on the charge storage layer 14, and a control gate electrode 18 is formed on the block insulating film 16. On both sides of the control gate electrode 18, a source region 20 and a drain region 22 are formed in the semiconductor layer 10. The region located below the control gate electrode 18 in the semiconductor layer 10 serves as a channel region 24. The channel region 24 is interposed between the source region 20 and the drain region 22.

The source region 20 and the drain region 22 are formed with n-type diffusion layers containing n-type impurities, for example.

Figure 15:
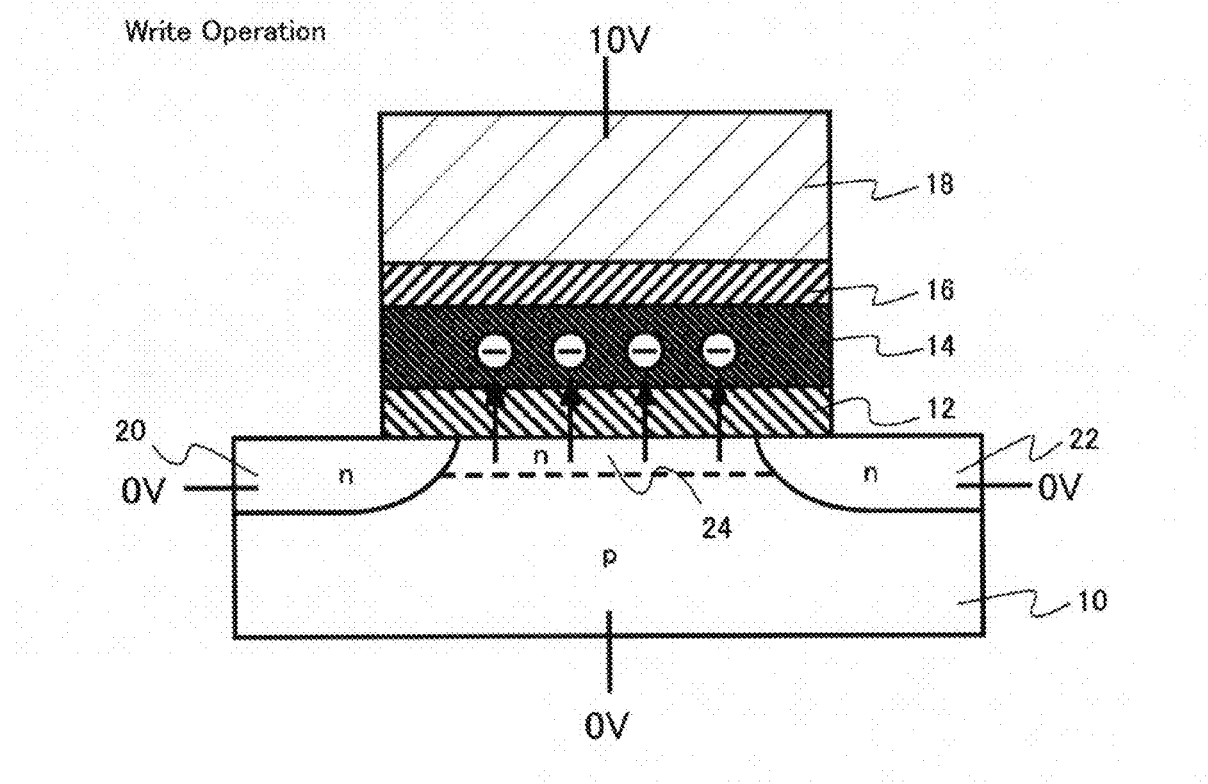
FIG. 15 is a diagram for explaining a memory cell write operation according to the second embodiment.

Next, examples of memory cell write, erase, and read operations are described. FIG. 15 is a diagram for explaining a memory cell write operation according to this embodiment.

In a memory cell write operation, a voltage is applied between the control gate electrode 18 and the semiconductor layer 10 so that the control gate electrode 18 has a positive voltage in a relative term, and negative charges are stored into the charge storage layer 14. As shown in FIG. 15, 10 V is applied to the control gate electrode 18, and 0 V is applied to the semiconductor layer 10, for example. 0 V is applied to the source region 20 and the drain region 22, for example.

An inversion layer is formed in the channel region 24, and electrons are stored. The electrons move in the tunnel insulating film 12, and are stored into the charge storage molecules of the charge storage layer 14.

Even when the voltage between the control gate electrode 18 and the semiconductor layer 10 is returned to 0 V, the stored electrons are maintained. In this state, the threshold value of the transistor of the memory cell becomes higher than that in a state where electrons are not stored. That is, the transistor is not easily turned on in this state. This state is a state where data "0" is written.

Figure 16:
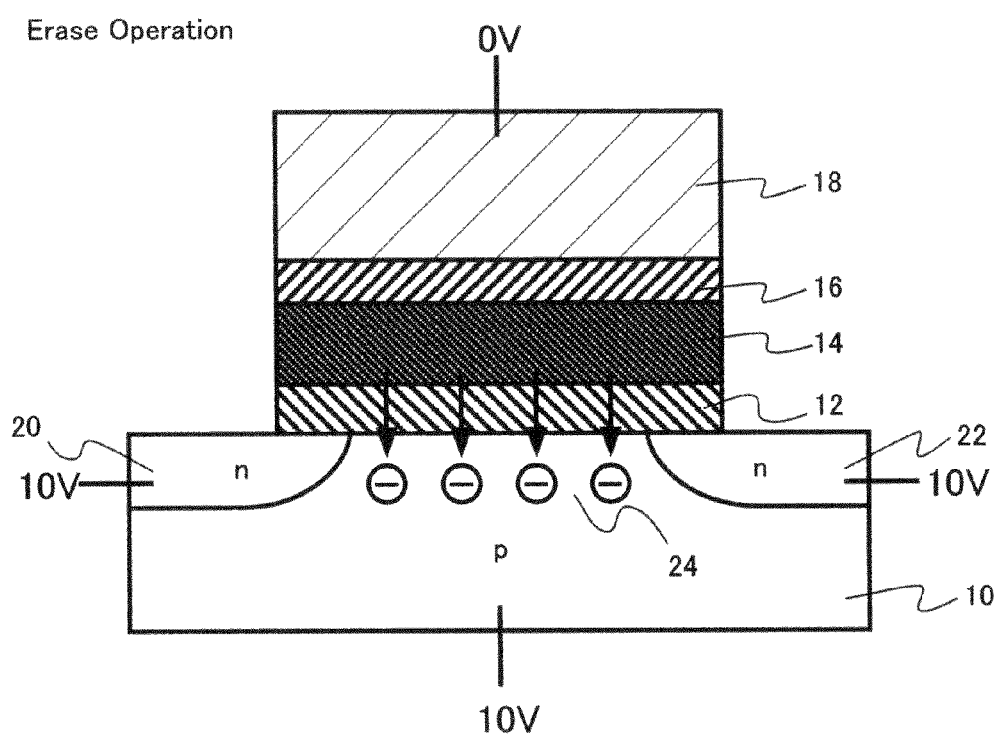
FIG. 16 is a diagram for explaining a memory cell erase operation according to the second embodiment.

FIG. 16 is a diagram for explaining a memory cell erase operation according to this embodiment. In a data erase operation, a voltage is applied between the control gate electrode 18 and the semiconductor layer 10 so that the voltage of the control gate electrode 18 becomes negative in a relative term. As shown in FIG. 16, 0 V is applied to the control gate electrode 18, and 10 V is applied to the semiconductor layer 10, for example. 10 V is applied to the source region 20 and the drain region 22, for example.

Because of the electric field between the control gate electrode 18 and the semiconductor layer 10, the electrons stored in the charge storage layer 14 move in the tunnel insulating film 12, and are pulled into the semiconductor layer 10.

When the voltage between the control gate electrode 18 and the semiconductor layer 10 is returned to 0 V, the stored charges disappear. Therefore, the threshold value of the transistor of the memory cell becomes lower than that in the data "0" state. That is, the transistor is easily turned on this state. This state is a data "1" state.

Figure 17A:
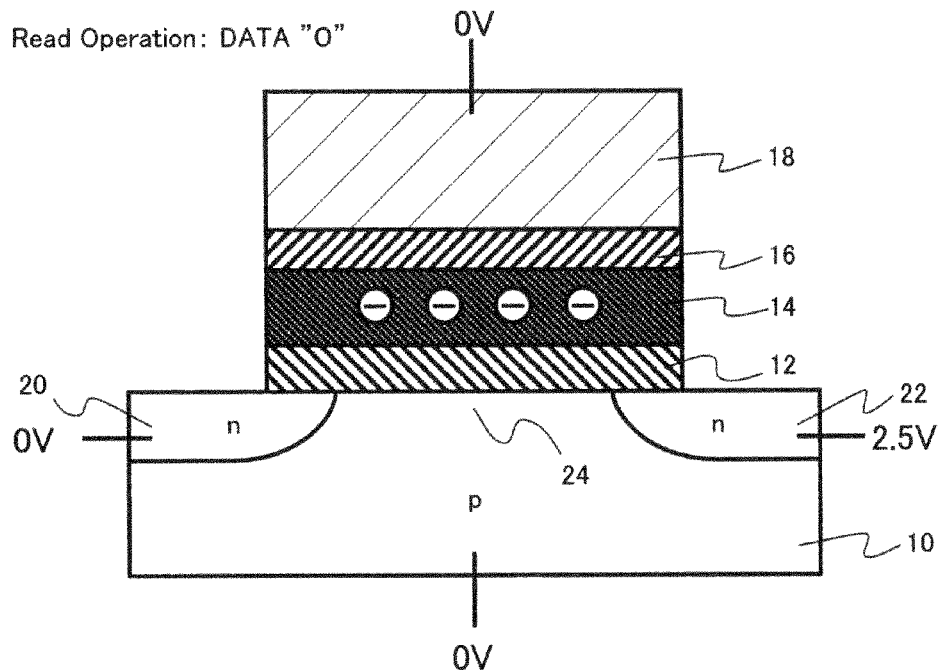
FIGS. 17A and 17B are diagrams for explaining memory cell read operations according to the second embodiment.
Figure 17B:
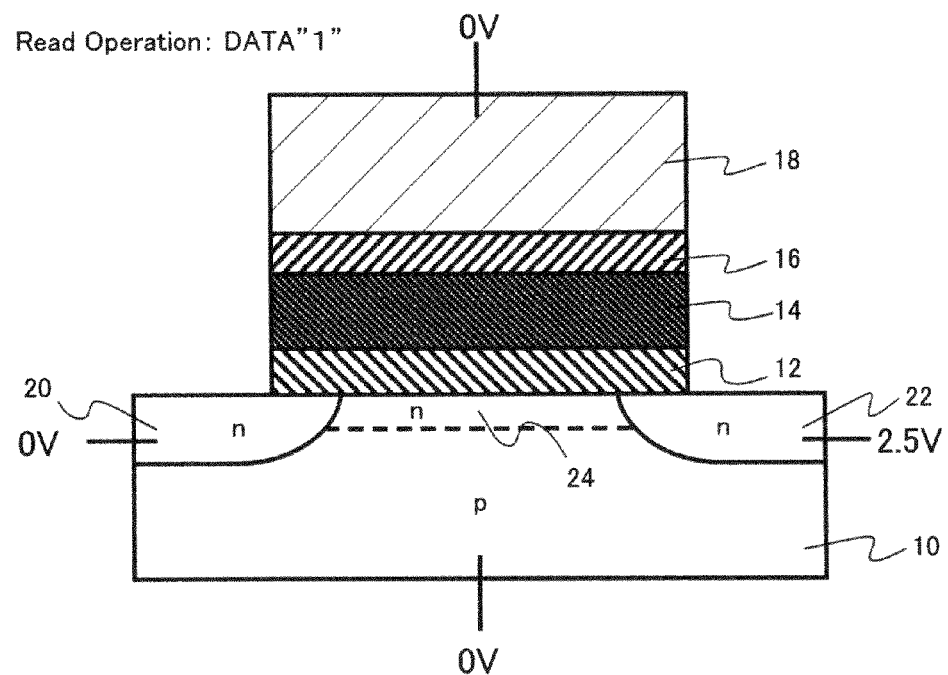

FIGS. 17A and 17B are diagrams for explaining memory cell read operations according to this embodiment. FIG. 17A is a data "0" read operation, and FIG. 17B is a data "1" read operation. In a data read operation, a voltage is applied between the source region 20 and the drain region 22.

As shown in FIGS. 17A and 17B, while 0 V is being applied between the control gate electrode 18 and the semiconductor layer 10, 0 V is applied to the source region 20, and 2.5 V is applied to the drain region 22, for example. As shown in FIG. 17A, in the data "0" state where electrons are stored, for example, the threshold value of the transistor is high. Therefore, an inversion layer is not formed in the channel region 24, and a current does not flow between the source and the drain.

On the other hand, in an erased state, or in the data "1" state where charges are not stored, as shown in FIG. 17B, the threshold value of the transistor is low. Therefore, an inversion layer is formed in the channel region 24, and the current flows between the source and the drain. As the amount of current in the transistor is sensed in this manner, the data "0" or the data "1" can be read out.

In a data verify operation to determine whether writing has been sufficiently performed after a data write operation is performed, the same operation as that in a read operation is performed. A voltage is applied between the source region 20 and the drain region 22, and if a desired current does not flow, a data write operation is again performed.

Memory cell write, erase, and read operations according to this embodiment are performed as described above, so as to realize a nonvolatile semiconductor memory device.

In this embodiment, organic molecules such as fullerene derivatives each having a structure with a function to store electrons should be selected as the charge storage molecules (the first organic molecules) 26 in the charge storage layer 14.

In this embodiment, negative charges are stored in the charge storage molecules 26. Therefore, so as to improve the write characteristics, the packing molecules (the second organic molecules) 27 are preferably such molecules that the overall orientation of the permanent dipoles is positive on the side of the semiconductor layer 10 and is negative on the side of the block insulating film 16.

On the other hand, so as to increase the charge retention time, the packing molecules (the second organic molecules) 27 are preferably such molecules that the overall orientation of the permanent dipoles is negative on the side of the semiconductor layer 10 and is positive on the side of the block insulating film 16.

So as to improve the write characteristics and increase the charge retention time at the same time, the packing molecules (the second organic molecules) 27 are preferably such molecules that the relative permittivity is approximately 3, for example, and the overall orientation of the permanent dipoles is negative on the side of the semiconductor layer 10 and is positive on the side of the block insulating film 16.

In this embodiment, charge storage molecules and packing molecules are used in the charge storage layer, as in the first embodiment. Accordingly, a nonvolatile semiconductor memory device that has excellent write characteristics and charge retention characteristics can be realized.

Third Embodiment

A nonvolatile semiconductor memory device of this embodiment includes: a semiconductor layer; an organic molecular layer that is formed on the semiconductor layer, and includes first organic molecules and second organic molecules having a smaller molecular weight than the first organic molecules, the first organic molecules each including a first alkyl chain or a first alkyl halide chain having one end bound to the semiconductor layer, the first organic molecules each including a charge storage portion bound to the other end of the first alkyl chain or the first alkyl halide chain, the second organic molecules each including a second alkyl chain or a second alkyl halide chain having one end bound to the semiconductor layer; a block insulating film formed on the organic molecular layer; and a control gate electrode formed on the block insulating film.

The nonvolatile semiconductor memory device of this embodiment is the same as that of the first embodiment, except that the tunnel insulating film is not provided, and the organic molecular layer has the function of the tunnel insulating film. Therefore, the same explanations as those in the first embodiment will not be repeated.

Figure 18:
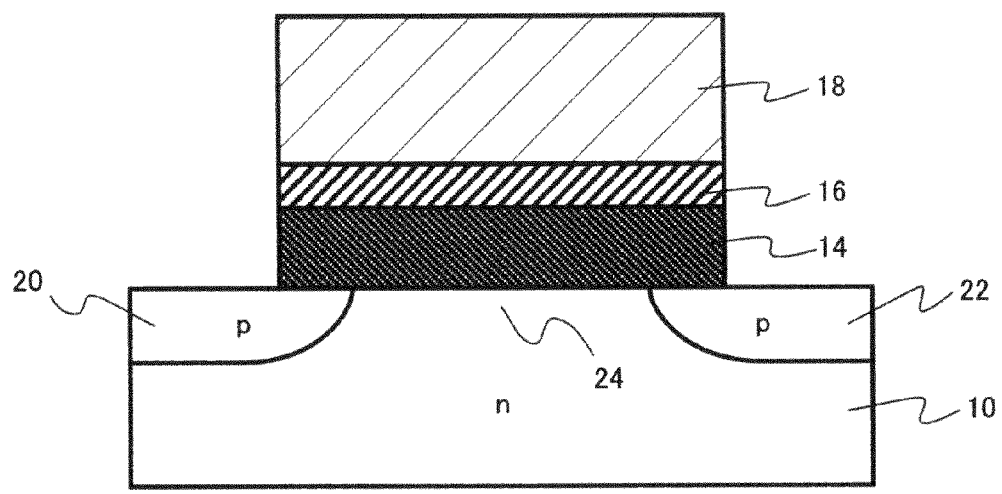
FIG. 18 is a cross-sectional view of a memory cell portion of a nonvolatile semiconductor memory device according to a third embodiment.

FIG. 18 is a cross-sectional view of a memory cell portion of the nonvolatile semiconductor memory device according to this embodiment.

The memory cells are formed on an n-type single-crystal silicon semiconductor layer 10 containing n-type impurities, for example. A charge storage layer (an organic molecular layer) 14 is formed on the silicon semiconductor layer 10, a block insulating film 16 is formed on the charge storage layer 14, and a control gate electrode 18 is formed on the block insulating film 16. On both sides of the control gate electrode 18, a source region 20 and a drain region 22 are formed in the semiconductor layer 10. The region located below the control gate electrode 18 in the semiconductor layer 10 serves as a channel region 24. The channel region 24 is interposed between the source region 20 and the drain region 22.

The source region 20 and the drain region 22 are formed with p-type diffusion layers containing p-type impurities, for example.

The first alkyl chains or the first alkyl halide chains, and the second alkyl chains or the second alkyl halide chains in the charge storage layer (the organic molecular layer) 14 have insulation properties, to realize the function of a tunnel insulating film.

The carbon number in each of the first and second alkyl chains or each of the first and second alkyl halide chains is preferably not smaller than 2 and not larger than 20, or more preferably, not smaller than 6 and not larger than 20. If the carbon number is below the above mentioned range, the insulation properties might be degraded. If the carbon number is beyond the above mentioned range, the film thickness might become greater, resulting in difficulties in scaling-down. Also, if the carbon number is beyond the above mentioned range, formation of a monomolecular layer might become difficult. More preferably, the carbon number in each of the alkyl chains is 18, because a self-assembled film can be stably manufactured with such a number.

In this embodiment, charge storage molecules and packing molecules are used in the charge storage layer, as in the first embodiment. Accordingly, a nonvolatile semiconductor memory device that has excellent write characteristics and charge retention characteristics can be realized. Furthermore, the tunnel insulating film is not necessary, and the manufacturing becomes easier accordingly.

Fourth Embodiment

A nonvolatile semiconductor memory device of this embodiment is the same as that of the third embodiment, except that the transistors of the memory cells are n-type transistors having electrons as carriers. Therefore, the same explanations as those in the third embodiment will not be repeated.

Figure 19:
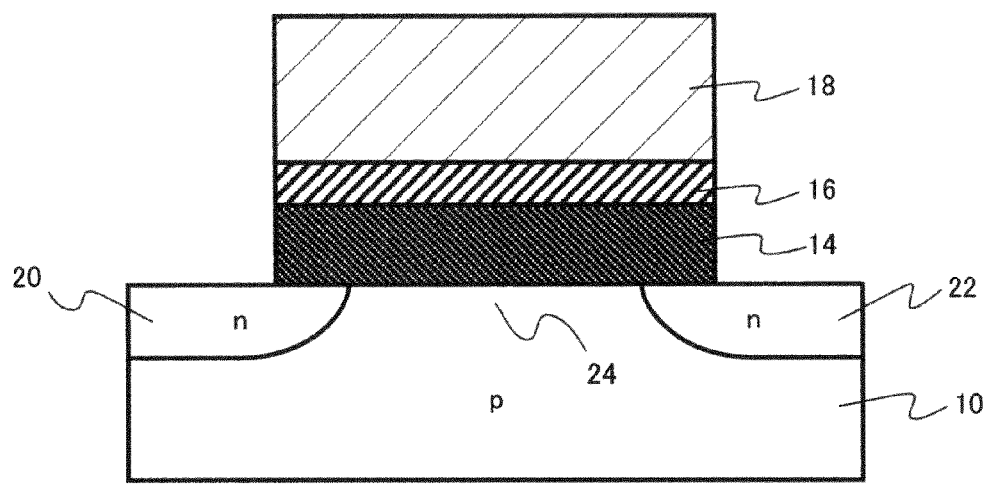
FIG. 19 is a cross-sectional view of a memory cell portion of a nonvolatile semiconductor memory device according to a fourth embodiment.

FIG. 19 is a cross-sectional view of a memory cell portion of the nonvolatile semiconductor memory device according to this embodiment.

The memory cells are formed on a p-type single-crystal silicon semiconductor layer 10 containing p-type impurities, for example. A charge storage layer (an organic molecular layer) 14 is formed on the silicon semiconductor layer 10, a block insulating film 16 is formed on the charge storage layer 14, and a control gate electrode 18 is formed on the block insulating film 16. On both sides of the control gate electrode 18, a source region 20 and a drain region 22 are formed in the semiconductor layer 10. The region located below the control gate electrode 18 in the semiconductor layer 10 serves as a channel region 24. The channel region 24 is interposed between the source region 20 and the drain region 22.

The source region 20 and the drain region 22 are formed with n-type diffusion layers containing n-type impurities, for example.

In this embodiment, charge storage molecules and packing molecules are used in the charge storage layer, as in the third embodiment. Accordingly, a nonvolatile semiconductor memory device that has excellent write characteristics and charge retention characteristics can be realized. Furthermore, the tunnel insulating film is not necessary, and the manufacturing becomes easier accordingly.

Fifth Embodiment

A nonvolatile semiconductor memory device of this embodiment includes: a substrate; a stack structure that is formed on the substrate, and has insulating layers and control gate electrode layers alternately stacked; a block insulating film that is formed along the side surface of a hole penetrating to the lowermost control gate electrode layer, the hole extending from the upper surface of the stack structure in the stacking direction of the stack structure; an organic molecular layer that is formed along the inner surface of the block insulating film, and includes first organic molecules and second organic molecules having a smaller molecular weight than the first organic molecules; a tunnel insulating film formed along the inner surface of the organic molecular layer; and a semiconductor layer formed along the inner surface of the tunnel insulating film. The first organic molecules each include a first alkyl chain or a first alkyl halide chain having one end bound to the tunnel insulating film, and a charge storage portion bound to the other end of the first alkyl chain or the first alkyl halide chain. Further, the second organic molecules each include a second alkyl chain or a second alkyl halide chain having one end bound to the tunnel insulating film.

The nonvolatile semiconductor memory device of this embodiment differs from that of the first embodiment in being a three-dimensional device utilizing the so-called BiCS (Bit-Cost Scalable) technique. The structure between the semiconductor layer and the gate electrode is the same as that of the first or second embodiment. Therefore, the same explanations as those in the first or second embodiment will not be repeated.

Figure 20:
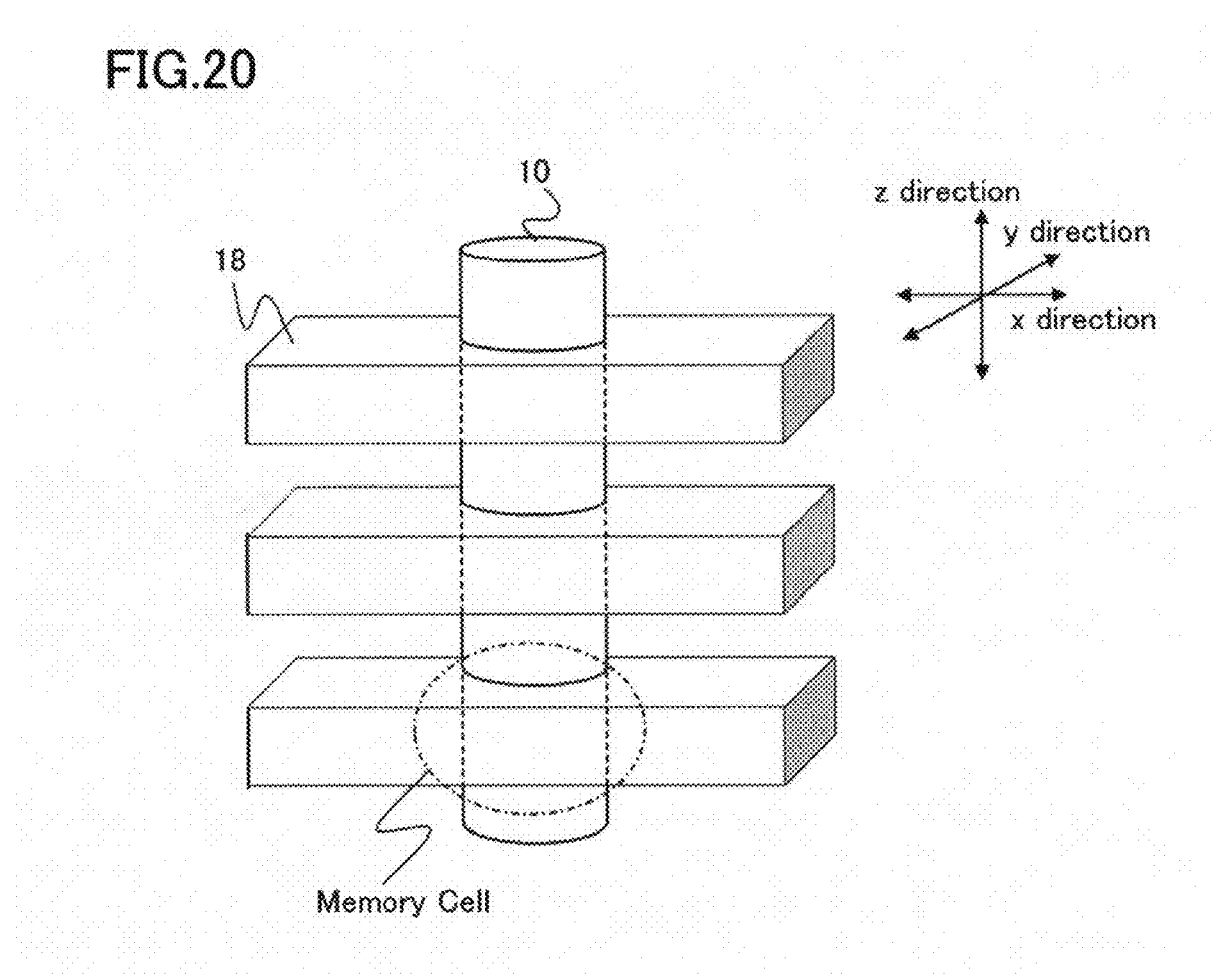
FIG. 20 is a three-dimensional conceptual diagram of a nonvolatile semiconductor memory device according to a fifth embodiment.
Figure 22:
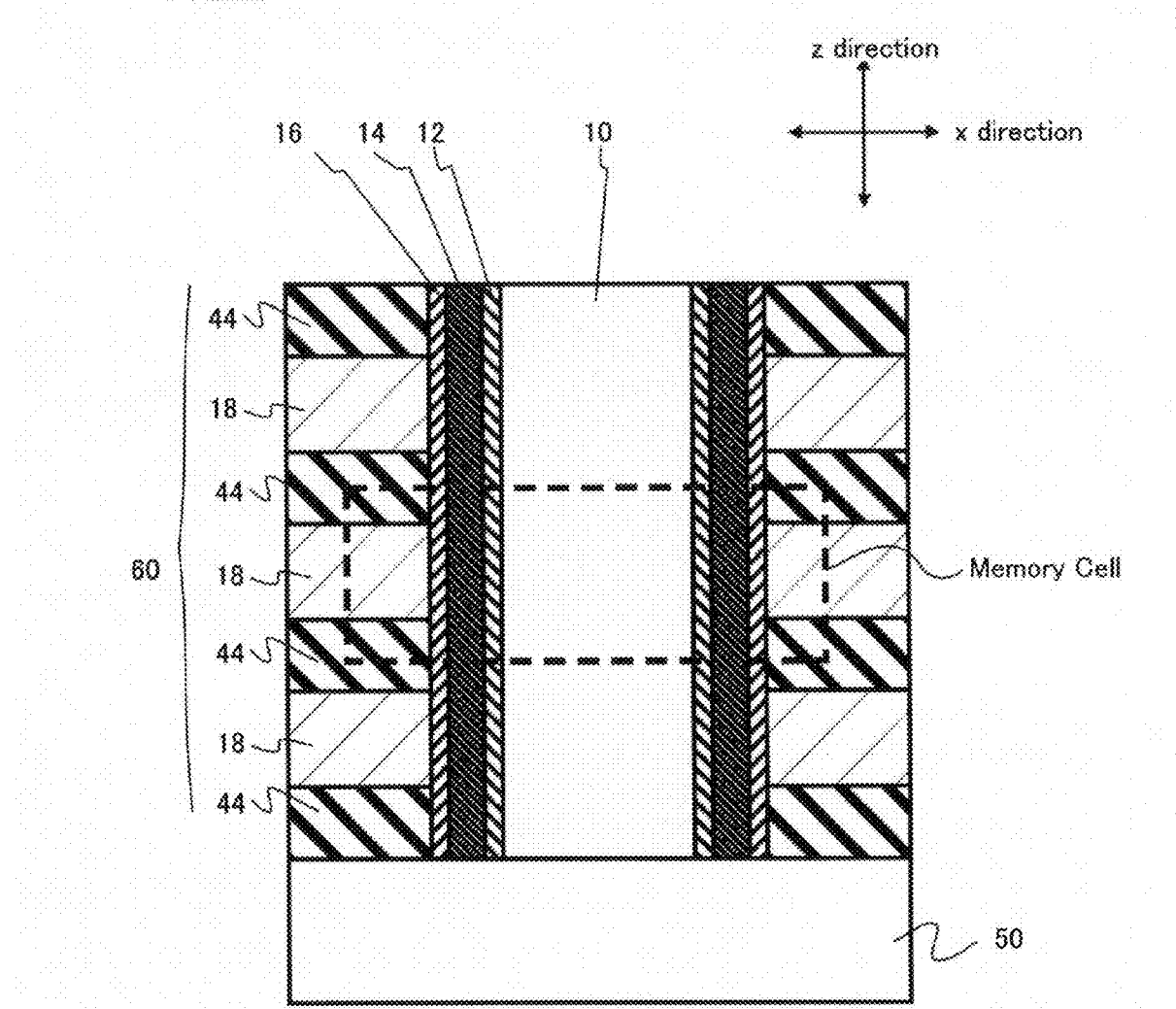
FIG. 22 is an X-Z cross-sectional view of the nonvolatile semiconductor memory device shown in FIG. 20.

FIG. 20 is a three-dimensional conceptual diagram of the nonvolatile semiconductor memory device of this embodiment. FIG. 21 is an X-Y cross-sectional view of the nonvolatile semiconductor memory device shown in FIG. 20. FIG. 22 is an X-Z cross-sectional view of the nonvolatile semiconductor memory device shown in FIG. 20.

The nonvolatile semiconductor memory device of this embodiment includes a stack structure 60 formed by alternately stacking insulating layers 44 and control gate electrodes 18 on a silicon substrate 50, for example.

A hole that extends from the upper surface of the stack structure 60 and penetrates to the lowermost control gate electrode layer 18 is formed. A block insulating film 16 is formed along the side surface of the hole, and a charge storage layer (an organic molecular layer) 14 is formed along the inner surface of the block insulating film 16.

A tunnel insulating film 12 is further formed along the inner surface of the charge storage layer 14. A columnar semiconductor layer 10 is also formed along the inner surface of the tunnel insulating film 12.

In each of FIGS. 20 and 22, the region surrounded by a dashed line is a memory cell. Each of the memory cells has a structure in which the tunnel insulating film 12 is formed on the semiconductor layer 10, the charge storage layer (the organic molecular layer) 14 is formed on the tunnel insulating film 12, and the control gate electrode 18 is formed on the charge storage layer 14.

As in the first and second embodiments, the charge storage layer (the organic molecular layer) 14 includes first organic molecules and second organic molecules having a smaller molecular weight than the first organic molecules. The first organic molecules each include a first alkyl chain or a first alkyl halide chain having one end bound to the tunnel insulating film, and a charge storage portion bound to the other end of the first alkyl chain or the first alkyl halide chain. The second organic molecules each include a second alkyl chain or a second alkyl halide chain having one end bound to the tunnel insulating film.

In this embodiment, charge storage molecules and packing molecules are used in the charge storage layer, as in the first and second embodiments. Accordingly, a nonvolatile semiconductor memory device that has excellent write characteristics and charge retention characteristics can be realized.

Furthermore, according to this embodiment, three-dimensional memory cells are formed, to increase the degree of memory cell integration. With this structure, a nonvolatile semiconductor memory device having a higher storage capacity than that of the first or second embodiment can be realized.

Also, a structure that does not include the tunnel insulating film 12 and has the charge storage layer (the organic molecular layer) 14 having the function of the tunnel insulating film 12 can be used as in the third and fourth embodiments.

EXAMPLES

In the following, examples are described.

Example 1

A film structure according to the first embodiment was formed and evaluated.

A p-type silicon substrate is used, and a two-terminal element is manufactured by the later described method. The amount of stored charges and the charge retention time can be checked by applying a pulse voltage for data writing to the device, and measuring the capacitance characteristics before and after the pulse voltage application.

The p-type silicon substrate was put into a thermal oxidation furnace, and a silicon oxide film was formed on the surface of the substrate. A result of film thickness measurement showed that the film thickness of the silicon oxide film was 5 nm.

The surface of the formed silicon oxide film was irradiated and cleaned with a UV cleaner for 10 minutes. The cleaned substrate was immersed in an anhydrous toluene solution formed by dissolving decylporphyrin derivatives (porphyrin derivatives having $C_{10}$ alkyl chains bound thereto) at a concentration of 1 mM. A catalyst was added at a concentration of 3% with respect to the anhydrous toluene, and the substrate was kept in that solution overnight.

After that, the substrate was pulled out, and was put into pure toluene. The substrate was then rinsed with a ultrasonic cleaner for one minute. The rinsing operation with toluene was repeated twice, with the toluene solution being replaced with a new one.

The substrate rinsed with toluene was then put into an anhydrous toluene solution formed by dissolving n-octyltrichlorosilane at a concentration of 10 mM, and was kept in that solution overnight.

After that, the substrate was pulled out, and was put into pure toluene. The substrate was then rinsed with a ultrasonic cleaner for one minute. The rinsing operation with toluene was repeated twice, with the toluene solution being replaced with a new one.

The substrate rinsed with toluene was further put into pure ethanol, and was rinsed with a ultrasonic cleaner for one minute, followed by drying with a nitrogen air duster.

The substrate was then put into a thermal-type ALD device, and a hafnium oxide film was formed at 150° C. on the surface to which decylporphyrin derivatives as the first organic molecules (the charge storage molecules) and n-octyltrichlorosilane as the second organic molecules (the packing molecules) were chemisorbed. A result of film thickness measurement showed that the film thickness of the hafnium oxide film was approximately 20 nm.

The back surface of the substrate was then immersed in concentrated hydrofluoric acid, and unnecessary oxide film formed on the back surface was removed. After the back surface was rinsed with pure water, aluminum was vapor-deposited on the back surface, to form an electrode on the substrate side. Also, gold was vapor-deposited on the upper surface of the hafnium oxide film on the substrate through a mask that was made of a metal and had a hole formed therein. In this manner, a gate electrode was formed. Lastly, the substrate was put into a RTA device, and was annealed in a $N_2$ gas atmosphere having 3% of $H_2$ mixed thereinto, at 300° C. for 30 minutes. In this manner, a two-terminal element was formed.

Example 2

As in Example 1, a film structure according to the first embodiment was formed and evaluated. However, the alkyl chains used as the second organic molecules (the packing molecules) in Example 1 were replaced with fluoroalkyl chains.

A p-type silicon substrate was put into a thermal oxidation furnace, and a silicon oxide film was formed on the surface of the substrate. A result of film thickness measurement showed that the film thickness of the silicon oxide film was 5 nm.

The surface of the formed silicon oxide film was irradiated and cleaned with a UV cleaner for 10 minutes. The cleaned substrate was immersed in an anhydrous toluene solution formed by dissolving decylporphyrin derivatives at a concentration of 1 mM. A catalyst was added at a concentration of 3% with respect to the anhydrous toluene, and the substrate was kept in that solution overnight.

After that, the substrate was pulled out, and was put into pure toluene. The substrate was then rinsed with a ultrasonic cleaner for one minute. The rinsing operation with toluene was repeated twice, with the toluene solution being replaced with a new one.

The substrate rinsed with toluene was put into pure ethanol, and was rinsed with a ultrasonic cleaner for one minute, followed by drying with a nitrogen air duster.

The substrate rinsed with ethanol was then put into a teflon container that can be hermetically sealed, and a glass container containing 5 ml of trichloro(1H,1H,2H,2H-heptadecafluorodecyl)silane was also put into the teflon container. The teflon container was hermetically sealed, and was heated for six hours.

In the later procedures, a hafnium oxide film was formed as in Example 1. A result of film thickness measurement showed that the film thickness of the hafnium oxide film was approximately 20 nm.

The back surface of the substrate was then immersed in concentrated hydrofluoric acid, and excess oxide film formed on the back surface was removed. After the back surface was rinsed with pure water, aluminum was vapor-deposited on the back surface, to form an electrode on the substrate side. Also, gold was vapor-deposited on the upper surface of the hafnium oxide film on the substrate through a mask that was made of a metal and had a hole formed therein. In this manner, agate electrode was formed. Lastly, the substrate was put into a RTA device, and was annealed in a $N_2$ gas atmosphere having 3% of $H_2$ mixed thereinto, at 300° C. for 30 minutes. In this manner, a two-terminal element was formed.

Comparative Example

Unlike Examples 1 and 2, this comparative example concerns a film structure that has only the first organic molecules (the charge storage molecules) and does not have the second organic molecules (the packing molecules) in the organic molecular layer. This film structure was formed and evaluated.

A p-type silicon substrate was put into a thermal oxidation furnace, and a silicon oxide film was formed on the surface of the substrate. A result of film thickness measurement showed that the film thickness of the silicon oxide film was 5 nm.

The surface of the formed silicon oxide film was irradiated and cleaned with a UV cleaner for 10 minutes. The cleaned substrate was immersed in an anhydrous toluene solution formed by dissolving decylporphyrin derivatives at a concentration of 1 mM. A catalyst was added at a concentration of 3% with respect to the anhydrous toluene, and the substrate was kept in that solution overnight.

After that, the substrate was pulled out, and was put into pure toluene. The substrate was then rinsed with a ultrasonic cleaner for one minute. The rinsing operation with toluene was repeated twice, with the toluene solution being replaced with a new one.

The substrate rinsed with toluene was put into pure ethanol, and was rinsed with a ultrasonic cleaner for one minute, followed by drying with a nitrogen air duster.

In the later procedures, a hafnium oxide film was formed as in Example 1. A result of film thickness measurement showed that the film thickness of the hafnium oxide film was approximately 20 nm.

The back surface of the substrate was then immersed in concentrated hydrofluoric acid, and unnecessary oxide film formed on the back surface was removed. After the back surface was rinsed with pure water, aluminum was vapor-deposited on the back surface, to form an electrode on the substrate side. Also, gold was vapor-deposited on the upper surface of the hafnium oxide film on the substrate through a mask that was made of a metal and had a hole formed therein. In this manner, a gate electrode was formed. Lastly, the substrate was put into a RTA device, and was annealed in a $N_2$ gas atmosphere having 3% of $H_2$ mixed thereinto, at 300° C. for 30 minutes. In this manner, a two-terminal element was formed.

The aluminum electrode of each of the elements of Example 1 and Comparative Example was contacted to the measurement stage. And measurement probe was contacted to the metal electrode on the upper surface. Then a voltage was applied to the examples. Capacitance measurement was carried out on each of the elements while the voltage was varied. A pulse voltage was then applied to each of the elements, and data writing was performed. Capacitance measurement was again performed while the voltage was varied, to measure the amount of stored charges.

Figure 23:
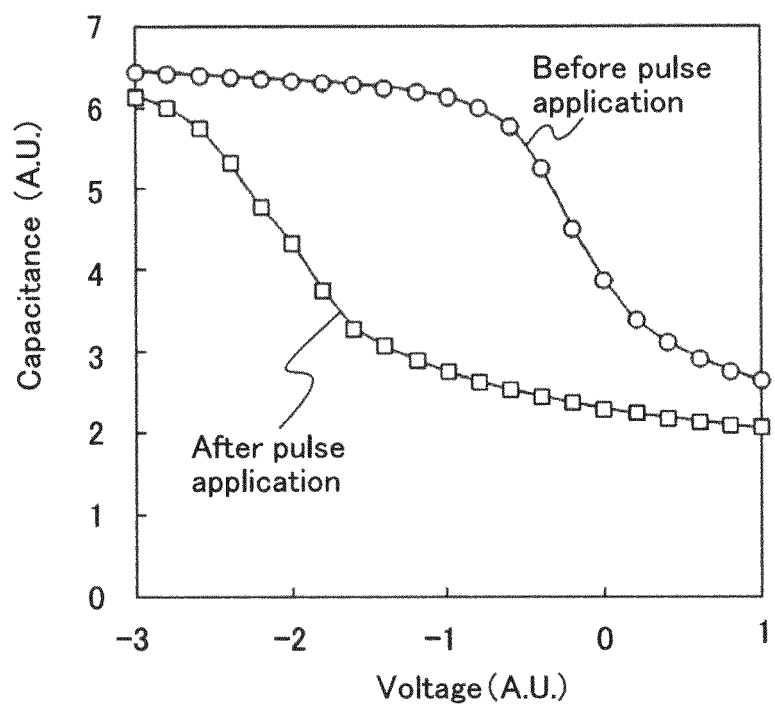
FIG. 23 is a graph showing the results of capacitance measurement in Example 1.

FIG. 23 is a graph showing the results of capacitance measurement in Example 1. The graph shows the results of capacitance measurement carried out on the element of Example 1, and the results of capacitance measurement again carried out after a pulse voltage of −20 V was applied to the gold gate electrode on the upper surface for an application time of 100 ms.

It was confirmed that a capacitance saturation region was observed, and the threshold voltage shifted in the negative direction when a change to the saturation region occurred. This voltage shift indicates that positive charges (holes) move from the p-type silicon substrate into the charge storage layer due to the pulse voltage applied through the gold gate electrode, and the positive charges are stored in the charge storage layer.

The density of the charges stored in the charge storage layer was determined by multiplying the value of the voltage shift and the value of the capacitance except the capacitance of silicon oxide. The capacitance of silicon oxide was determined with the relative permittivity of silicon oxide fixed at 3.9.

Figure 24:
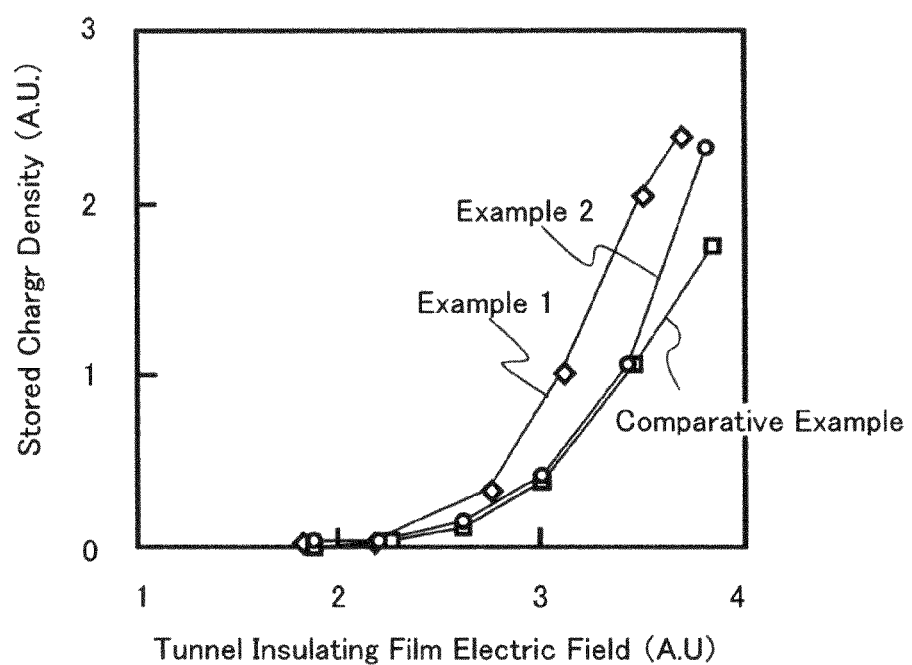
FIG. 24 is a graph showing the applied electric field dependencies of the stored charge densities of Example 1, Example 2, and Comparative Example.

FIG. 24 is a graph showing the applied electric field dependencies of the stored charge densities of Example 1, Example 2, and Comparative Example. In each of the elements of Example 1, Example 2, and Comparative Example, a pulse voltage was applied to the gold control gate electrode for an application time of 100 ms, during which the voltage was varied. The shift amount of the capacitance threshold voltage after pulse voltage application was measured in the same manner as above, and the density of the charges stored in the charge storage layer was determined by multiplying the shift amount and the value of the capacitance except the capacitance of silicon oxide. In the graph, the ordinate axis indicates the stored charge density, and the abscissa axis indicates the calculated value of the intensity of the electric field applied to the tunnel insulating film made of silicon oxide at the time of pulse voltage application.

As can be seen from FIG. 24, positive charges are stored by applying a pulse voltage in all the cases of Example 1, Example 2, and Comparative Example. Where comparisons are made at the same electric field intensity, the stored charge density is apparently higher and charges are stored with a lower electric field in each of the elements of Example 1 and Example 2 than in the element of Comparative Example.

Next, the stored charge retention time was measured in each of Example 2 and Comparative Example. The stored charge retention time was evaluated by determining the degree of attenuation of the value of the capacitance threshold voltage shifting upon pulse voltage application through capacitance measurement carried out again after a certain period of time, as shown in FIG. 23.

Figure 25:
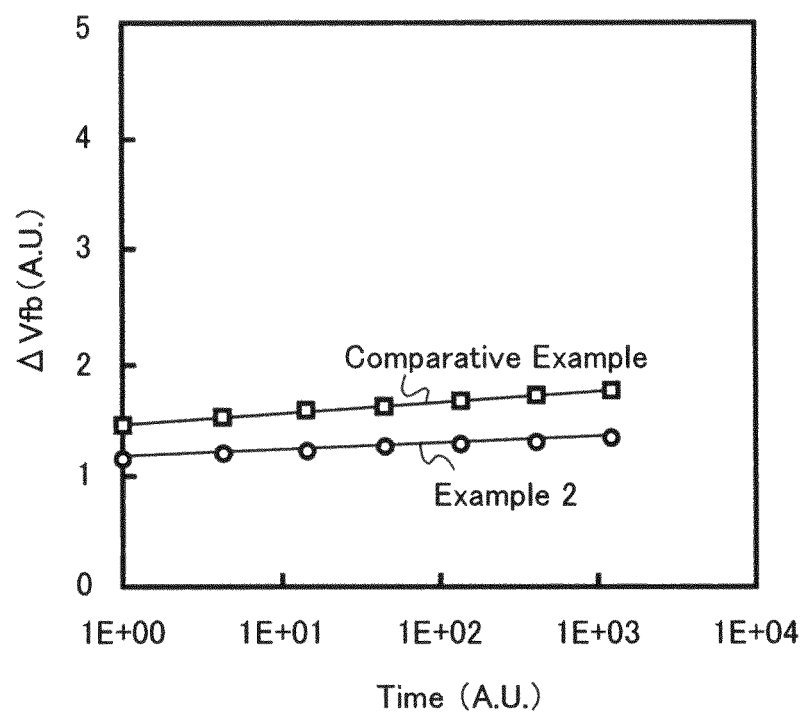
FIG. 25 is a graph showing the charge retention characteristics of Example 2 and Comparative Example.
Figure 26:
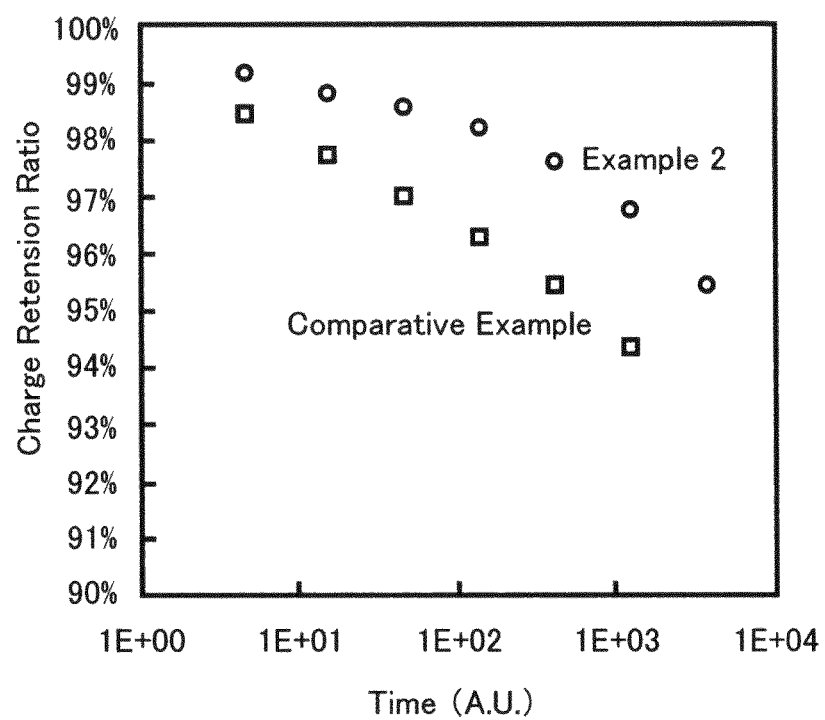
FIG. 26 is a graph showing the charge retention characteristics of Example 2 and Comparative Example.

FIGS. 25 and 26 are graphs showing the charge retention characteristics of Example 2 and Comparative Example. In each of Example 2 and Comparative Example, a pulse voltage was applied to the gold control gate electrode so that the stored charge density became approximately $2 \times 10^{13}$ cm$^{-2}$. The capacitance threshold voltage (Vfb) that shifted due to positive charge storage was again measured after a certain period of time. In this manner, the capacitance threshold voltage was examined.

FIG. 25 shows a graph in which the threshold voltage that varied with time is plotted. Approximate linearization was logarithmically performed on the plotted dots, and the time that the Vfb attenuated to 5% from the initial Vfb measured immediately after pulse application was measured. FIG. 26 shows a graph in which the ratio (or proportion) of retained charges is plotted with respect to time.

The time that elapsed before the threshold voltage ($V_{FB}$) attenuated 5% in Example 2 is 13 times longer than that in Comparative Example. Accordingly, it has become apparent that the stored charge retention time in Example 2 is longer than that in Comparative Example, or Example 2 has better retention characteristics than Comparative Example.

With trichloro(1H,1H,2H,2H-heptadecafluorodecyl)silane, trichlorosilyl groups are also adsorbed to the surface of the tunnel oxide film, to form a molecular film. The permanent dipoles are approximately 3.2 debyes when calculated through a molecular orbital calculation. The orientation of the permanent dipoles is substantially positive on the substrate (semiconductor layer) side, and is negative on the block insulating film side.

In a case where positive charges move into and are stored in the charge storage layer, the orientation of the permanent dipoles is the orientation in which the positive charges stored in the charge storage molecules are stabilized. As trichloro (1H,1H,2H,2H-heptadecafluorodecyl)silane was introduced as the packing molecules in this manner, the retention characteristics were improved.

While certain embodiments have been described, these embodiments have been presented by way of example only, and are not intended to limit the scope of the inventions. Indeed, non-volatile semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a semiconductor layer;
    a tunnel insulating film formed on the semiconductor layer;
    an organic molecular layer formed on the tunnel insulating film, the organic molecular layer including first organic molecules and second organic molecules having a smaller molecular weight than the first organic molecules, the first organic molecules each including a first alkyl chain or a first alkyl halide chain having one end bound to the tunnel insulating film, the first organic molecules each including a charge storage portion bound to the other end of the first alkyl chain or the first alkyl halide chain, the second organic molecules each including a second alkyl chain or a second alkyl halide chain having one end bound to the tunnel insulating film, the second organic molecules each having a permanent dipole;
    a block insulating film formed on the organic molecular layer; and
    a control gate electrode formed on the block insulating film,
    wherein in a case where positive charges are stored in the charge storage portion, an orientation of the permanent dipole is positive on the side of the semiconductor layer and negative on the side of the block insulating film, and in a case where negative charges are stored in the charge storage portion, an orientation of the permanent dipole is negative on the side of the semiconductor layer and positive on the side of the block insulating film.

2. A nonvolatile semiconductor memory device comprising:
    a semiconductor layer;
    a tunnel insulating film formed on the semiconductor layer;
    an organic molecular layer formed on the tunnel insulating film, the organic molecular layer including first organic molecules and second organic molecules having a smaller molecular weight than the first organic molecules, the first organic molecules each including a first alkyl chain or a first alkyl halide chain having one end bound to the tunnel insulating film, the first organic molecules each including a charge storage portion bound to the other end of the first alkyl chain or the first alkyl halide chain, the second organic molecules each including a second alkyl chain or a second alkyl halide chain having one end bound to the tunnel insulating film, the second organic molecules each having a permanent dipole;

a block insulating film formed on the organic molecular layer; and a control gate electrode formed on the block insulating film, wherein in a case where positive charges are stored in the charge storage portion, an orientation of the permanent dipole is negative on the side of the semiconductor layer and positive on the side of the block insulating film, and in a case where negative charges are stored in the charge storage portion, an orientation of the permanent dipole is positive on the side of the semiconductor layer and negative on the side of the block insulating film.

* * * * *